(12) United States Patent
Nakashima et al.

(10) Patent No.: US 10,765,001 B2
(45) Date of Patent: Sep. 1, 2020

(54) THERMOPLASTIC LIQUID CRYSTAL POLYMER FILM, CIRCUIT BOARD, AND METHODS RESPECTIVELY FOR MANUFACTURING SAID FILM AND SAID CIRCUIT BOARD

(71) Applicant: KURARAY CO., LTD., Kurashiki-shi (JP)

(72) Inventors: Takahiro Nakashima, Saijo (JP); Takeshi Takahashi, Saijo (JP); Minoru Onodera, Saijo (JP)

(73) Assignee: KURARAY CO., LTD., Kurashiki-shi (JP)

( * ) Notice: Subject to any disclaimer, the term of this patent is extended or adjusted under 35 U.S.C. 154(b) by 107 days.

(21) Appl. No.: 15/084,554

(22) Filed: Mar. 30, 2016

(65) Prior Publication Data

US 2016/0212845 A1   Jul. 21, 2016

Related U.S. Application Data

(63) Continuation of application No. PCT/JP2014/075875, filed on Sep. 29, 2014.

(30) Foreign Application Priority Data

Oct. 3, 2013  (JP) ................................ 2013-208209
Mar. 27, 2014  (JP) ................................ 2014-065751
Jun. 10, 2014  (JP) ................................ 2014-119850

(51) Int. Cl.
*H05K 1/02* (2006.01)
*H05K 1/03* (2006.01)
(Continued)

(52) U.S. Cl.
CPC ............... *H05K 1/036* (2013.01); *B32B 3/04* (2013.01); *B32B 7/05* (2019.01); *B32B 15/08* (2013.01);
(Continued)

(58) Field of Classification Search
CPC ............ H05K 1/036; H05K 2201/0129; H05K 2201/0141; H05K 3/4611; H05K 1/0298;
(Continued)

(56) References Cited

U.S. PATENT DOCUMENTS 4,561,922 A * 12/1985 Peerman ............ C08G 18/3206
156/331.4
5,235,008 A * 8/1993 Hefner, Jr. ............ C08F 290/14
525/526

(Continued)

FOREIGN PATENT DOCUMENTS

CN   1790644 A    6/2006
CN   101223835 A  7/2008
(Continued)

OTHER PUBLICATIONS

Gore Tex Inc, Production method of electronic circuit board, 2008, JP2008-103559 English Translation (Year: 2008).*

(Continued)

*Primary Examiner* — Steven T Sawyer
(74) *Attorney, Agent, or Firm* — Oblon, McClelland, Maier & Neustadt, L.L.P.

(57) ABSTRACT

Provided are a thermoplastic liquid crystal polymer film having an improved thermo-adhesive property, a circuit board, and methods respectively for producing the same. The thermoplastic liquid crystal polymer film has a segment orientation ratio SOR of 0.8 to 1.4 and a moisture content of 300 ppm or less. The circuit board contains a plurality of circuit board materials wherein the circuit board materials are at least one member selected from the group consisting of an insulating substrate having a conductor layer on at least one surface, a bonding sheet, and a coverlay. At least one of the circuit board materials includes a thermoplastic liquid crystal polymer film. The circuit board shows a solder heat (Continued)

resistance when the circuit board is placed in a solder bath at 290° C. for 60 seconds in accordance with JIS C 5012.

15 Claims, 4 Drawing Sheets

(51) Int. Cl.
| | |
|---|---|
| B32B 15/08 | (2006.01) |
| B32B 27/08 | (2006.01) |
| B32B 15/20 | (2006.01) |
| H05K 3/46 | (2006.01) |
| C08J 5/18 | (2006.01) |
| B32B 3/04 | (2006.01) |
| B32B 7/05 | (2019.01) |
| C09K 19/38 | (2006.01) |
| B32B 27/36 | (2006.01) |

(52) U.S. Cl.
CPC ............. *B32B 15/20* (2013.01); *B32B 27/08* (2013.01); *C08J 5/18* (2013.01); *C09K 19/3809* (2013.01); *H05K 1/0298* (2013.01); *H05K 1/0326* (2013.01); *H05K 3/4611* (2013.01); *H05K 3/4632* (2013.01); *B32B 27/36* (2013.01); *B32B 2307/306* (2013.01); *B32B 2307/50* (2013.01); *B32B 2457/08* (2013.01); *C08J 2367/04* (2013.01); *H05K 2201/0129* (2013.01); *H05K 2201/0141* (2013.01)

(58) Field of Classification Search
CPC ...... H05K 3/4632; H05K 3/38; H05K 1/0326; B32B 3/04; B32B 7/045; B32B 15/08; B32B 27/08; B32B 15/20; B32B 7/05; B32B 27/36; B32B 2457/08; B32B 2307/306; B32B 2307/50; C08J 7/00; C08J 5/18; C08J 2367/04; C09K 19/3809
See application file for complete search history.

(56) References Cited

U.S. PATENT DOCUMENTS

| | | | | |
|---|---|---|---|---|
| 5,995,361 A | * | 11/1999 | Jayaraj | H01G 4/18 |
| | | | | 264/289.3 |
| 6,334,922 B1 | | 1/2002 | Tanaka et al. | |
| 2004/0040651 A1 | * | 3/2004 | Tsugaru | H05K 3/4617 |
| | | | | 156/272.2 |
| 2004/0253441 A1 | * | 12/2004 | Bansal | D01F 8/14 |
| | | | | 428/373 |
| 2005/0067739 A1 | * | 3/2005 | Onodera | B29C 71/02 |
| | | | | 264/345 |
| 2006/0180343 A1 | * | 8/2006 | Chan | H05K 3/383 |
| | | | | 174/256 |
| 2009/0065240 A1 | | 3/2009 | Onodera et al. | |
| 2009/0229869 A1 | | 9/2009 | Harada et al. | |
| 2010/0047517 A1 | * | 2/2010 | Zama | C22C 1/002 |
| | | | | 428/137 |
| 2011/0278049 A1 | * | 11/2011 | Kim | G03F 7/037 |
| | | | | 174/254 |
| 2012/0223455 A1 | * | 9/2012 | Shintani | H01L 51/003 |
| | | | | 264/234 |
| 2014/0226285 A1 | * | 8/2014 | Bauer | H01L 23/10 |
| | | | | 361/736 |

FOREIGN PATENT DOCUMENTS

| | | |
|---|---|---|
| CN | 102655119 | 9/2012 |
| JP | 2-96101 A | 4/1990 |
| JP | 2000-286537 A | 10/2000 |
| JP | 2001-270032 | 10/2001 |
| JP | 2002-307617 A | 10/2002 |
| JP | 2003-221456 | 8/2003 |
| JP | 2006-165269 A | 6/2006 |
| JP | 2006-192903 | 7/2006 |
| JP | 2007-131724 | 5/2007 |
| JP | 2008-73985 A | 4/2008 |
| JP | 2008-205413 | 9/2008 |
| JP | 2010-62468 | 3/2010 |
| JP | 2010-103269 | 5/2010 |
| JP | 2011-71815 | 4/2011 |
| JP | 2013-84847 | 5/2013 |
| TW | 201132247 A1 | 9/2011 |
| TW | 201339386 A | 10/2013 |
| WO | WO2012/020818 A1 | 2/2012 |
| WO | WO 2012/090733 A1 | 7/2012 |

OTHER PUBLICATIONS

International Search Report dated Jan. 13, 2015 in PCT/JP2014/075875, filed Sep. 29, 2014 (with English Translation).
Vectra LCP "Liquid Crystal Polymer(LCP)", Jan. 27, 2016, 14 Pages (with Partial Computer Generated English Translation).
Yoshinobu Tanaka et al. "Liquid Crystal Polymer Material for LSI-Mounting", Journal of the Japan Institute of Electronics Packaging, vol. 2, No. 2, 1999, 7 Pages (with Partial Computer Generated English Translation).
Third Party Observation dated Jan. 28, 2016 in PCT/JP2014/075875.
Notification of Reasons for Refusal dated Jul. 3, 2018 in Japanese Patent Application No. 2015-540482 (with unedited computer generated English translation), 9 pages.
Combined Office Action and Search Report dated Mar. 8, 2018 in Taiwanese Patent Application No. 103134333 with English translation of the Search Report, 8 pages.
Combined Office Action and Search Report dated Mar. 5, 2018 in Chinese Patent Application No. 201480054977.X with English translation of the Search Report, 6 pages.
Notification of Reasons for Refusal dated Sep. 18, 2018, in Japanese Patent Application No. 2015-540482 (with machine English translation).
Office Action dated Nov. 12, 2018 in Chinese Patent Application No. 201480054977.X (with English translation), filed Sep. 29, 2014.
Combined Office Action and Search Report dated Feb. 22, 2019 in Chinese Patent Application No. 201480054977.X, 16 pages (with unedited computer generated English translation and English translation of categories of cited documents).
Notice of Reasons for Refusal in corresponding Japanese Application No. 2019-048134, dated Mar. 31, 2020. (w/English Machine Translation).

* cited by examiner

EX4

SUBDUCTION PERCENTAGE
(L2/L1)  94.8%

EX5

SUBDUCTION PERCENTAGE
(L2/L1)  94.8%

COM EX4

SUBDUCTION PERCENTAGE
(L2/L1)  72.8%

THERMOPLASTIC LIQUID CRYSTAL POLYMER FILM, CIRCUIT BOARD, AND METHODS RESPECTIVELY FOR MANUFACTURING SAID FILM AND SAID CIRCUIT BOARD

CROSS REFERENCE TO THE RELATED APPLICATION

This application is a continuation application, under 35 U.S.C. § 111(a), of international application No. PCT/JP2014/075875, filed Sep. 29, 2014, which claims priority to Japanese patent applications No. 2013-208209 filed Oct. 3, 2013, No. 2014-065751 filed Mar. 27, 2014, and No. 2014-119850 filed Jun. 10, 2014, the entire disclosures of which are herein incorporated by reference as a part of this application.

FIELD OF THE INVENTION

The present invention relates to a film of a thermoplastic liquid crystal polymer capable of forming an optically anisotropic melt phase (hereinafter may be referred to as a thermoplastic liquid crystal polymer film, or TLCP film, or simply abbreviated as a liquid crystal polymer film, or LCP film) having an improved thermo-adhesive property, and a method for producing the same, and to a circuit board and a method for producing the same.

BACKGROUND ART

Electronics such as information processing devices and communication equipment generally include circuit boards inside. A circuit board typically includes an insulating-material substrate and a conductive-material layer on the substrate, and the conductive-material layer includes circuits to form a predetermined circuit pattern. Various electronic components can be mounted on the circuit board by means of processing such as soldering. Recently a multilayer circuit board having a plurality of conductor layers has come to be widely used.

There has been known a conventional circuit board including a polyimide as an insulating material, for example, a circuit board that comprises (i) a wiring substrate comprising a polyimide film and a circuit formed from a conductor layer on the polyimide film and (ii) a coverlay comprising a polyimide film and an adhesive layer to be bonded to the wiring substrate.

However, such a circuit board sometimes has poor heat resistance, especially poor solder heat resistance, due to usage of an adhesive. Further, some circuit boards contain residual solvent originated from the adhesive. The presence of the solvent in the circuit boards may cause defects in the circuit board after multi-layering process, resulting in deterioration of reliability of the circuit boards. Accordingly, a technique for forming a circuit board without using an adhesive has been desired.

In recent years, there have been remarkable developments in the field of information processing, such as personal computers, as well as in the field communication equipment, such as mobile phones. Such electronics and communication equipment have come to be operated at higher frequencies of gigahertz region. In the high frequency band, however, it is known that the electronics and communication equipment generally have increased in transmission loss.

Circuit boards have been conventionally known as one comprising a wiring substrate in which a conductor circuit is formed on a polyimide film, and a coverlay film bonded on the wiring substrate, the coverlay film comprising a polyimide film and an adhesive layer.

However, such a circuit board sometimes has poor heat resistance, especially poor solder heat resistance, due to adhesive usage. Further, some circuit boards contain residual solvent originated from the adhesive. The presence of the solvent in the circuit boards may cause defects in the circuit board after multi-layering process, resulting in deterioration of reliability of the circuit boards. Accordingly, a technique for forming a circuit board without using an adhesive has been desired.

On the other hand, TLCP films have attracted attention as substrate materials for forming circuit boards without using an adhesive. The TLCP film, however, contains rigid skin layers on the surfaces, the skin layers generated during extrusion. Where the TLCP films are heat-bonded with each other, the skin layers sometimes interrupt sufficient interlayer adhesion between the TLCP films.

In order to improve adhesive property, for example, Patent Document 1 (JP Laid-open Patent Publication No. 2010-103269) discloses a method for producing a multilayer circuit board including: extruding a thermoplastic liquid crystal polymer (TLCP) capable of forming an optically anisotropic melt phase to form a TLCP film, softening at least one surface of the TLCP film by physical grinding or UV radiation to render the film surface to have a hardness of 0.01 to 0.1 GPa measured in accordance with the nanoindentation method so as to form an adhesive surface, and counterposing the adhesive surface on a circuit surface of a wiring substrate comprising a conductor circuit on at least one surface of a TLCP film capable of forming an optically anisotropic melt phase and carrying out a thermo-compression bonding of the entire components.

In the meanwhile, where a circuit board is produced without usage of an adhesive by laminating a conductor layer of a metal such as copper to be bonded to a LCP layer, a process for accomplishing an improved peel strength (strength against peeling) has been carried out by forming an uneven surface on the conductor layer to enhance compressive adhesion between the conductor layer and the insulating layer by an anchoring effect of the uneven surface. The optimization of the uneven structure has been studied.

For example, Patent Document 2 (WO 2012/020818) discloses a metal-clad laminate having a metal foil on one or both surfaces of a liquid crystal polymer layer, wherein the metal foil has projections on a surface layer portion on a side to be in contact with the LCP layer, the projection being formed by roughening the metal foil surface; the projections have an aspect ratio (H/L) of a projection height H with respect to a projection bottom width L in a range of 3 to 20; the projection height is in a range of 0.1 to 2 μm; and the LCP layer has a thickness of 10 to 2000 μm and a thickness tolerance of less than 6%.

SUMMARY OF THE INVENTION

Patent Document 1 achieves the enhanced interlayer adhesion between liquid crystal polymer films by carrying out the softening treatment of the skin layers by physical polishing or ultraviolet radiation. Patent Document 1, however, fails to disclose or suggest improvement in interlayer adhesion between liquid crystal polymer films without causing damage to the skin layer.

Patent Document 2 describes that the roughening treatment of the metal foil improves interlayer adhesion between the liquid crystal polymer film and the metal foil, but does not recognize improvement in interlayer adhesion between liquid crystal polymer films by carrying out a specific treatment on the liquid crystal polymer films. Further, the invention described in this document has not been studied disadvantages caused by existence of projections on the metal foil against the liquid crystal polymer.

An object of the present invention is to provide a liquid crystal polymer film having an improved thermo-adhesive property and making possible to improve interlayer adhesion between the film and an adherend, and a method producing the same.

Another object of the present invention is to provide a circuit board having an improved interlayer adhesion and a method producing the same.

Based on the result of intensive studies to achieve the above objects, the inventors of the present invention have found the following aspects of the present invention.

That is, a first aspect of the present invention relates to a method for producing a TLCP film at least including:

preparing a TLCP film being capable of forming an optical anisotropic melt phase and having a segment orientation ratio SOR of 0.8 to 1.4, degassing the TLCP film by degassing the film (i) under vacuum of 1500 Pa or lower for 30 minutes or more, and/or by degassing the film (ii) under heating at a temperature ranging from 100° C. to 200° C., and thereby producing a TLCP film having a segment orientation ratio SOR of 0.8 to 1.4 and a moisture content of 300 ppm or less.

In the above production method, the degassing process may include:

a first degassing of the TLCP film by heating the prepared TLCP film under heating at a temperature ranging from 100° C. to 200° C. for a predetermined period of time, and a second degassing of the first-degassed TLCP film by further degassing the TLCP film after the first degassing under vacuum of 1500 Pa or lower for a predetermined period of time. Preferably, the degassing under vacuum (i) or the second degassing process may be carried out under heating the film at a temperature ranging from 80° C. to 200° C. under vacuum of 1500 Pa or lower.

Further, the TLCP film to be subjected to degassing may be preferably in roll form.

A second aspect of the present invention embraces a TLCP film having an improved thermo-adhesive property (thermo-adhesion-improved TLCP film). Such a TLCP film has a segment orientation ratio SOR of 0.8 to 1.4 and a moisture content of 300 ppm or less. Further, the TLCP film may have a film thickness of about 10 to 200 µm. The TLCP film may be produced by the above-described production method. The TLCP film may be a TLCP film wrapped with a packaging material having a gas barrier property (gas-barrier packaging material).

It should be noted that the present invention might embrace a packaged TLCP film product comprising a TLCP film having thermo-adhesive property and a packaging material having gas barrier property.

In the packaging structure, the gas barrier packaging material may have an oxygen permeability of, for example, 10 mL/m²·day·MPa or less. Further, the gas barrier packaging material may have a moisture permeability of, for example, 10 g/m²/day or less.

A third aspect of the present invention relates to a method for producing a circuit board at least including:

preparing a plurality of circuit board materials;

stacking the prepared circuit board materials in accordance with a predetermined structure of a circuit board to obtain a stacked material, followed by conducting thermo-compression bonding of the stacked material by heating the stacked material under a predetermined compression pressure; wherein the prepared circuit board materials are at least one member selected from the group consisting of an insulating substrate having a conductor layer on at least one surface, a bonding sheet, and a coverlay, and (I) at least one of the prepared circuit board materials comprises a degassed TLCP film having an improved thermo-adhesive property, the TLCP film being subjected to degassing as recited above and/or (II) at least one of the prepared circuit board materials comprises a non-degassed TLCP film, and the degassing process as recited above is conducted after the preparation of the circuit board materials and before the thermo-compression bonding.

In the production method, at least one of the circuit board materials may comprise a TLCP film having an improved thermo-adhesive property.

In the production method, among the circuit board materials selected from the group consisting of an insulating substrate, a bonding sheet, and a coverlay, at least two circuit board materials may comprise a first LCP film having a higher melting point and higher heat resistance and a second LCP film having a lower melting point and lower heat resistance than the first LCP film. The difference in melting point between the first and second LCP films may be within 70° C.

In the method for producing the circuit board, the thermo-compression bonding process may include a thermo-compression bonding conducted under a compression pressure of 5 MPa or lower (preferably 0.5 to 2.5 MPa). For example, the circuit board materials may be subjected to thermo-compression bonding by heating the materials at a temperature ranging from (Tm−60) ° C. to (Tm+40) ° C., where Tm is the melting point of the TLCP film subjected to the thermo-compression bonding.

A fourth aspect of the present invention embraces a circuit board comprising a plurality of circuit board materials, wherein:

the circuit board materials are at least one member selected from the group consisting of an insulating substrate having a conductor layer on at least one surface, a bonding sheet, and a coverlay;

at least one of the circuit board materials comprises a TLCP film; and the circuit board shows a solder heat resistance when the circuit board is placed in a solder bath at a temperature of 290° C. for 60 seconds in accordance with a method of JIS C 5012. The circuit board may be a circuit board produced by the above-described production method.

Preferably, the circuit board may have a bonding strength between the TLCP film and a circuit board material in contact with the TLCP film, in a value measured in accordance with JIS C5016-1994, of 0.8 kN/m or higher where the circuit board material is an insulating substrate material (e.g., TLCP film), or 0.3 kN/m or higher where the circuit board material is a conductor layer.

It should be noted that where circuit board material has a conductive material portion, bonding strength is determined depending on the surface area ratio of the conductive material portion in contact with the TLCP film. The surface area ratio may be determined as existing ratio of conductive material as follows:

Existing ratio of conductive material =

(Surface area of circuit patterns on circuit board unit in contact with the target LCP film) / (Surface area of entire circuit board unit) × 100

Where the ratio is 30% or more, the bonding strength is measured as a bonding strength between the LCP film and a conductor layer. Where the ratio is less than 30%, the bonding strength is measured as a bonding strength between the LCP film and an insulating substrate material.

Preferably, the circuit board may have a favorably isotropic bonding strength. For example, where the TLCP film and the circuit board material are peeled off along a first direction (A direction) or along a second direction (B direction) perpendicular to the first direction to measure the bonding strength between the TLCP film and the circuit board material in accordance with JIS C5016-1994, the minimum value of bonding strength in four directions of a forward A direction, an adverse A direction, a forward B direction, and an adverse B direction may be:

(i) 0.5 kN/m or higher where the circuit board material is an insulating substrate material, or (ii) 0.25 kN/m or higher where the circuit board material is a conductor layer.

In the circuit board, at least two circuit board materials may be TLCP films. In the circuit board, a conductor layer may be interposed between a first TLCP film and a second TLCP film. The difference in melting point between the first TLCP film and the second TLCP film may be in a range from 0° C. to 70° C.

All of the circuit board materials selected from the group consisting of an insulating substrate, a bonding sheet, and a coverlay may comprise TLCP films. An insulating substrate may be bonded to another insulating substrate without a bonding sheet. An insulating substrate may be bonded to a coverlay without a bonding sheet.

Preferably, the circuit board may have a conductor layer with a smooth surface. For example, at least one surface of the conductor layer may have a surface roughness ($Rz_{JIS}$) of 1.25 μm or less as an average value of ten-points measured according to a method conforming to ISO4287-1997.

As an indicator to show reduction in thickness of the circuit board, for example, a circuit board may have (n+1) layers of TLCP film layers and n layers of conductor circuit layers, each of the conductor circuit layer being interposed between TLCP film layers. In this case, the circuit board may comprise TLCP films to be adhered with each other in a state interposing the conductor circuit layers without using a bonding sheet.

An L2/L1 ratio may be used as an indication of the degree of subduction of the circuit board, where L1 denotes the thickness of the insulating substrate portion at which the conductor circuit is not formed, and L2 denotes the thickness of the insulating substrate portion at which the conductor circuit is formed. Where the subduction of the conductor circuit in the circuit board is suppressed, the L2/L1 ratio in percentage may be from 80 to 100%.

The circuit board may be a circuit board comprising a conductor circuit having a strip line structure or a microstrip line structure.

The present invention may encompass a circuit board produced by the above-described production method. The circuit board of the present invention may be either a single-layer circuit board having one layer of conductor layer or a multi-layer circuit board having a plurality of conductor layers as described above.

The present invention, as another aspect, may also encompass inventions as described below.

A fifth aspect of the present invention may be a method of producing a circuit board, the method comprising:

preparing at least one unit circuit board and at least one TLCP film as a circuit board material to be adhered to the unit circuit board, the unit circuit board comprising a TLCP film and a conductor layer formed on one or the both surfaces of the thermoplastic liquid crystal polymer film, and the circuit board material being adhered to the surface of the conductor layer;

performing a first degassing of the unit circuit board(s) and the circuit board material(s) under heating at a temperature ranging from 100° C. to 200° C. for a predetermined period of time, for example, under the ambient pressure;

performing a second degassing the of the unit circuit board(s) and the circuit board material(s) under vacuum of 1500 Pa or lower;

performing integration of a stacked material formed by stacking the at least one circuit board material and the at least one unit circuit board by thermo-compression bonding by application of heat and pressure to the stacked material, wherein the surface of the conductor layer in contact with the circuit board material has a surface roughness ($Rz_{JIS}$) of 1.25 μm or less as an average value of ten-points measured according to a method conforming to ISO 4287-1997.

The second degassing may be carried out at a temperature in a range from 80° C. to 200° C. The second degassing may be performed substantially without applying compression pressure. The circuit board material may be at least one selected from the group consisting of a bonding sheet and a coverlay.

Also, the preparation process of the unit circuit board may comprise:

thermo-compression bonding of a metal foil(s) to a TLCP film on one or both surfaces of the TLCP film; and forming an oxidation-resistant coat on the metal surface of the thermo-compressed metal foil(s).

The conductor layer may preferably include a copper layer made of a copper foil. The conductor layer may preferably include an alloy layer containing copper as an oxidation-resistant coating.

The preparation process of the unit circuit board may further comprise applying a silane-coupling agent on the conductor layer surface.

A sixth aspect of the present invention may be a circuit board produced by the above method.

In the sixth aspect of the present invention, the circuit board may be a circuit board comprising one or more unit circuit boards and one or more circuit board materials to be bonded to the unit circuit board(s), wherein at least one of the unit circuit boards comprises a TLCP film and a conductor layer(s) formed on one or both sides of the TLCP film surface, the conductor layer(s) having a surface roughness ($Rz_{JIS}$) of 1.25 μm or less as an average value of ten points measured in accordance with ISO 4287-1997 on the surface bonded to the circuit board material, at least one of the circuit board materials comprises a TLCP film, and the circuit board shows a solder heat resistance when the circuit board is placed in a solder bath at a temperature of 290° C. for 60 seconds in accordance with the method conforming to JIS C 5012.

According to the first aspect of the present invention, a specific degassing process can improve thermo-adhesive property of a TLCP film, while maintaining an isotropic property of the TLCP film. As a result, even without an adhesive agent, interlayer adhesion of the circuit board comprising a LCP film(s) can be enhanced.

Further, by packing the TLCP film subjected to a specific degassing process with a gas barrier packaging material, the TLCP film can be transported or conveyed as a packaged product containing the TLCP film while maintaining a degassed condition.

According to the method for producing the TLCP film according to the second aspect, the TLCP film having improved adhesion property can be efficiently produced.

The circuit board according to the third aspect of the present invention can suppress local adhesion failure by enhancing the interlayer adhesive property of the circuit board even using a TLCP film(s). The circuit board can inhibit occurrence of blisters on the circuit board during a high temperature treatment such as a reflow process for mounting electronic components on the circuit board. Further, interlayer adhesion without adhesive usage enables to enhance reliability of the circuit board.

According to the fourth aspect of the present invention, a method for producing a circuit board can achieve production of such a circuit board in an efficient way.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims, and:

DESCRIPTION OF EMBODIMENTS

Figure 1:
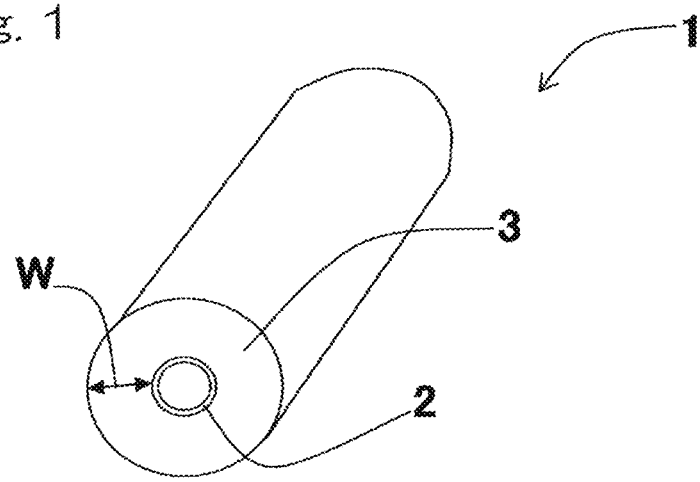
FIG. 1 is a schematic cross-sectional view for illustrating a shape of the rolled material formed of a TLCP film according to one embodiment of the present invention.

The first aspect of the present invention is based on the findings as described below. That is, (i) TLCP films have the highest level of gas barrier properties among various organic materials, probably because of having a rigid mesogenic groups. This is a great advantage of TLCP films in comparison with other organic materials. Accordingly, the necessity of degassing of TLCP films has never been conceived in the past. (ii) However, for reasons that are uncertain, the presence of gasifiable components such as moisture contained in thermoplastic liquid crystal polymer, and/or moisture adsorbed on the surface of the TLCP film and/or air existing on the surface of the TLCP film may cause deterioration in interlayer adhesion between the film and an adherend, and it has been assumed that such gasifiable components may cause blisters in the circuit board provided with the TLCP film at a high temperature. (iii) Based on the above assumption, the inventors of the present invention have found that where a specific degassing process is carried out to a TLCP film, surprisingly, the degassed TLCP film can achieve improved adhesive property with maintaining isotropic property of the film so as to enhance interlayer adhesion between the film and an adherend as well as to suppress the occurrence of blisters on the circuit board even exposed to a high temperature condition.

Production Method of TLCP Film

One embodiment of the present invention is a method for producing a TLCP film, the method at least includes:

preparing a TLCP film being capable of forming an optical anisotropic melt phase and having a segment orientation ratio SOR of 0.8 to 1.4, and degassing the TLCP film by degassing the TLCP film (i) under vacuum of 1500 Pa or lower for 30 minutes or more, and/or by degassing the TLCP film (ii) under heating at a temperature ranging from 100° C. to 200° C., so as to produce a TLCP film having a segment orientation ratio SOR of 0.8 to 1.4 and a moisture content of 300 ppm or less.

Preparation Step of TLCP Film

The TLCP film to be prepared is formed from a melt-processable liquid crystalline polymer. In particular, chemical formulation of the thermoplastic liquid crystal polymer is not particularly limited to a specific one as long as it is a liquid crystalline polymer that can be melt-processable, and examples thereof may include a thermoplastic liquid crystal polyester, or a thermoplastic liquid crystal polyester amide obtained by introducing an amide bond thereto.

Furthermore, the thermoplastic liquid crystal polymer may be a polymer obtained by further introducing, to an aromatic polyester or an aromatic polyester amide, an imide bond, a carbonate bond, a carbodiimide bond, or an isocyanate-derived bond such as an isocyanurate bond.

Specific examples of the thermoplastic liquid crystal polymer used in the present invention may include known thermoplastic liquid crystal polyesters and thermoplastic liquid crystal polyester amides obtained from compounds classified as (1) to (4) as exemplified in the following, and derivatives thereof. However, it is needless to say that, in order to form a polymer capable of forming an optically anisotropic melt phase, there is a suitable range regarding the combination of various raw-material compounds.

(1) Aromatic or aliphatic dihydroxy compounds (see Table 1 for representative examples)

TABLE 1

Chemical structural formulae of representative examples of aromatic or aliphatic dihydroxyl compounds

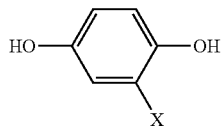

X represents a hydrogen atom or a halogen atom, or a group such as a lower alkyl (e.g., $C_{1-3}$ alkyl) or a phenyl

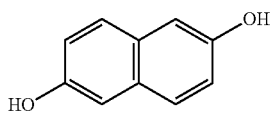

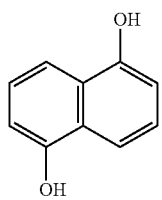 [SMILES: Oc1cccc2c(O)cccc12]

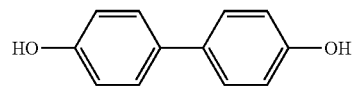

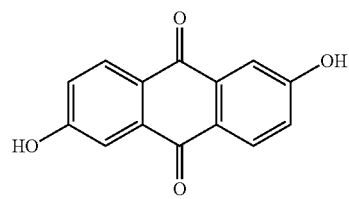 [SMILES: O=C1c2ccc(O)cc2C(=O)c2ccc(O)cc21]

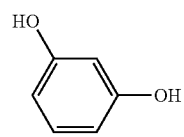

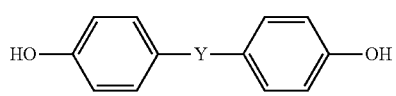

Y represents a group such as
—O—, —CH$_2$—,
—S—, —CO—,
—C(CH$_3$)$_2$—, or
—SO$_2$—

HO(CH$_2$)$_n$OH
n is an integer of 2 to 12

(2) Aromatic or aliphatic dicarboxylic acids (see Table 2 for representative examples)

TABLE 2

Chemical structural formulae of representative examples of aromatic or aliphatic dicarboxylic acids

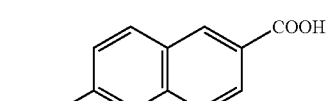

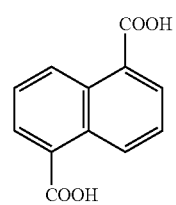 [SMILES: O=C(O)c1cccc2c(C(=O)O)cccc12]

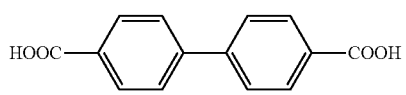 [SMILES: O=C(O)c1ccc(-c2ccc(C(=O)O)cc2)cc1]

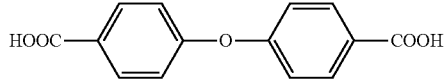

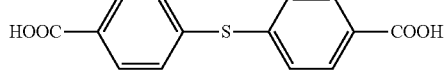

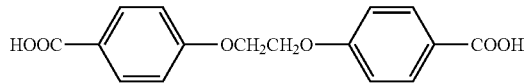

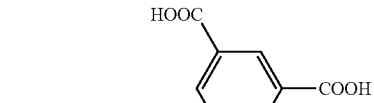

HOOC(CH$_2$)$_n$COOH
n is an integer of 2 to 12

(3) Aromatic hydroxycarboxylic acids (see Table 3 for representative examples)

TABLE 3

Chemical structural formulae of representative examples of aromatic or aliphatic hydroxy-carboxylic acids

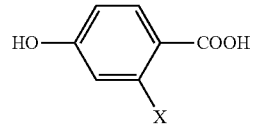

X represents a hydrogen atom or a halogen atom, or a group such as a lower alkyl (e.g., $C_{1-3}$ alkyl) or a phenyl

TABLE 3-continued

Chemical structural formulae of representative examples of aromatic or aliphatic hydroxy-carboxylic acids

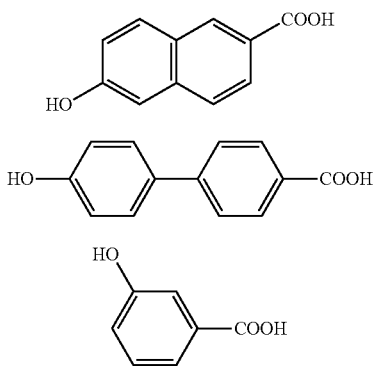

(4) Aromatic diamines, aromatic hydroxy amines, and aromatic aminocarboxylic acids (see Table 4 for representative examples)

TABLE 4

Chemical structural formulae of representative examples of aromatic diamines, aromatic hydroxy amines, or aromatic aminocarboxylic acids

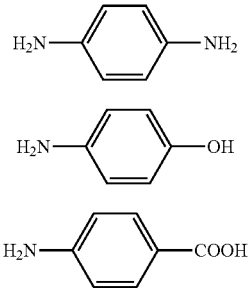

Representative examples of liquid crystal polymers obtained from these raw-material compounds may include copolymers having structural units shown in Tables 5 and 6.

TABLE 5

Representative examples (1) of a thermoplastic liquid crystal polymer

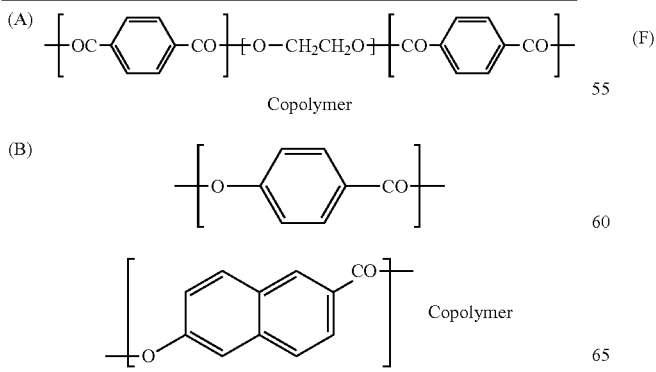

TABLE 5-continued

Representative examples (1) of a thermoplastic liquid crystal polymer

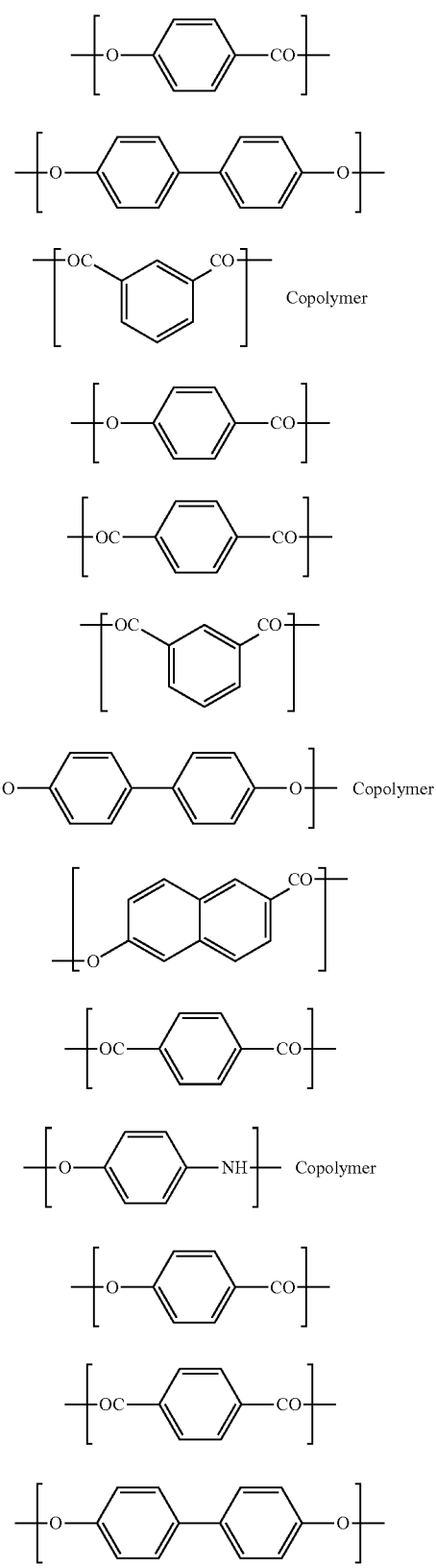

TABLE 5-continued

Representative examples (1) of a thermoplastic liquid crystal polymer

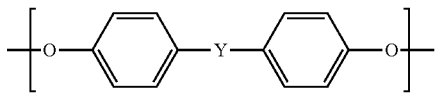

Y is a group such as —O—,
—CH$_2$—, or —S—

Copolymer

TABLE 6

Representative examples (2) of thermoplastic liquid crystal polymer (G)

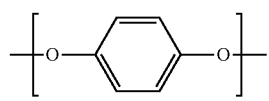

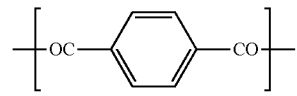

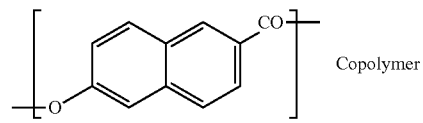

Copolymer (H)

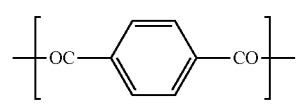

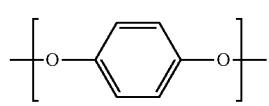

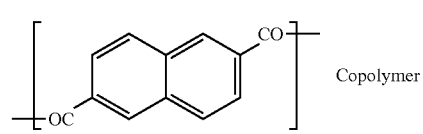

Copolymer (I)

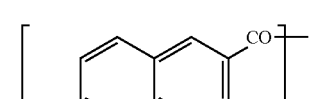

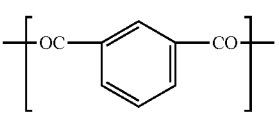

TABLE 6-continued

Representative examples (2) of thermoplastic liquid crystal polymer

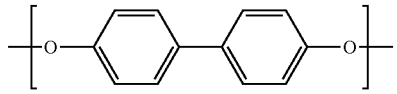

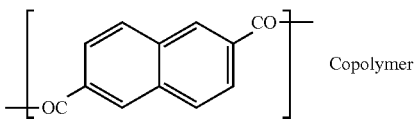

Copolymer

Of these copolymers, polymers including at least p-hydroxybenzoic acid and/or 6-hydroxy-2-naphthoic acid as repeating units are preferable; and particularly preferred polymers include:

a polymer (i) having repeating units of p-hydroxybenzoic acid and 6-hydroxy-2-naphthoic acid, and a polymer (ii) having repeating units of at least one aromatic hydroxycarboxylic acid selected from a group consisting of p-hydroxybenzoic acid and 6-hydroxy-2-naphthoic acid, at least one aromatic diol selected from a group consisting of 4,4'-dihydroxybiphenyl and hydroquinone, and at least one aromatic dicarboxylic acid selected from a group consisting of terephthalic acid, isophthalic acid, and 2,6-naphthalene dicarboxylic acid.

For example, in the case where the polymer (i) comprises a thermoplastic liquid crystal polymer having repeating units of at least p-hydroxybenzoic acid (A) and 6-hydroxy-2-naphthoic acid (B), the liquid crystal polymer may have a mole ratio (A)/(B) of preferably about (A)/(B)=10/90 to 90/10, more preferably about (A)/(B)=50/50 to 85/15, and further preferably about (A)/(B)=60/40 to 80/20.

Furthermore, in the case where the polymer (ii) comprises a liquid crystal polymer having repeating units of at least one aromatic hydroxycarboxylic acid (C) selected from a group consisting of p-hydroxybenzoic acid and 6-hydroxy-2-naphthoic acid, at least one aromatic diol (D) selected from a group consisting of 4,4'-dihydroxybiphenyl and hydroquinone, and at least one aromatic dicarboxylic acid (E) selected from a group consisting of terephthalic acid, isophthalic acid, 2,6-naphthalene dicarboxylic acid, the liquid crystal polymer may have a mole ratio of aromatic hydroxycarboxylic acid (C):aromatic diol (D):aromatic dicarboxylic acid (E)=30 to 80:35 to 10:35 to 10, more preferably about (C):(D):(E)=35 to 75:32.5 to 12.5:32.5 to 12.5, and further preferably about (C):(D):(E)=40 to 70:30 to 15:30 to 15.

Furthermore, the liquid crystal polymer may have a mole ratio of a repeating structural unit derived from an aromatic dicarboxylic acid relative to a repeating structural unit derived from an aromatic diol of preferably (D)/(E)=95/100 to 100/95. Deviation from this range may tend to result in a low degree of polymerization and deterioration in mechanical strength.

It should be noted that, in the present invention, optical anisotropy in a molten state can be determined by, for example, placing a sample on a hot stage, heating the sample with an elevating temperature under nitrogen atmosphere, and observing light transmitted through the sample.

Preferred thermoplastic liquid crystal polymer has a melting point (hereinafter, referred to as Tm$_0$) in a range from 260° C. to 360° C., and more preferably from 270° C. to (J)

350° C. The melting point is determined by measuring the temperature at which the main endothermic peak appears using a differential scanning calorimeter (Shimadzu Corporation DSC).

As long as the advantageous effect of the present invention is not deteriorated, to the thermoplastic liquid crystal polymer, may be added any thermoplastic polymer such as a polyethylene terephthalate, a modified polyethylene terephthalate, a polyolefin, a polycarbonate, a polyarylate, a polyamide, a polyphenylene sulfide, a polyether ether ketone, and a fluorine resin; and/or various additives. If necessary, a filler may be added to the thermoplastic liquid crystal polymer.

The TLCP film used in the present invention can be obtained by extruding a thermoplastic liquid crystal polymer. As long as the direction of rigid rod-like molecules of the thermoplastic liquid crystal polymer can be controlled, any extrusion method may be applied. In particular, well-known methods such as a T-die method, a laminate-stretching method, and an inflation method (tubular blown film extrusion method) are industrially advantageous. In particular, the inflation method or the laminate-stretching method can apply stresses not only in a machine direction of the film (or the machine processing direction, hereinafter referred to as MD direction), but also in a transverse direction (hereinafter, abbreviated as TD direction) perpendicular to the MD direction. Accordingly, the inflation method or the laminate-stretching method can be advantageously used to obtain a film having controlled properties such as molecular orientation and dielectric characteristics in both the MD and TD directions.

The extrusion molding is preferably accompanied by a stretching treatment in order to control the orientation. For example, in the extrusion molding using a T-die method, a molten polymer sheet extruded from a T-die may be stretched in the MD direction and the TD direction at the same time, alternatively a molten polymer sheet extruded from a T-die may be stretched in sequence, first in the MD direction and then the TD direction.

Also, in the extrusion molding using an inflation method, a tubular sheet being melt-extruded from an annular die may be drawn with a predetermined draw ratio (corresponding to a stretching ratio in the MD direction) and a predetermined blow ratio (corresponding to a stretching ratio in the TD direction).

The stretching ratios carried out in such extrusion molding may be, as a stretching ratio in the MD direction (or draw ratio), for example, about 1.0 to 10, preferably about L2 to 7, and more preferably 1.3 to 7; and/or as a stretching ratio in the TD direction (or blow ratio), for example, about 1.5 to 20, preferably 2 to about 15, and still more preferably about 2.5 to 14.

The ratio of the TD direction-stretching ratio relative to the MD direction-stretching ratio (TD direction/MD direction), may be, for example, 2.6 or less, preferably about 0.4 to 2.5.

If necessary, the extrusion-molded TLCP film may be subjected to further stretching. The stretching method itself is known, and either biaxial stretching or uniaxial stretching may be employed. From the viewpoint of easy control of molecular orientation, biaxial stretching is preferable. The stretching may be carried out using a known machine such as a uniaxial stretching machine, a simultaneous biaxial stretching machine, and a sequential biaxial stretching machine.

If necessary, a known or conventional heat treatment may be carried out in order to control a melting point and/or thermal expansion coefficient of the TLCP film. Heat treatment conditions can be set appropriately depending on the purpose. The heat treatment may be carried out by heating for hours at a temperature of, for example, $(Tm_0-10)$ ° C. or higher, wherein $Tm_0$ denotes a melting point of a liquid crystal polymer, for example, about $(Tm_0-10)$ ° C. to $(Tm_0+30)$ ° C., and preferably about $Tm_0$° C. to $(Tm_0+20)$ ° C. to increase a melting point (Tm) of the TLCP film.

Thus-obtained TLCP film according to the present invention has improved properties such as dielectric properties, gas barrier properties and low moisture absorption, thus the TLCP film can be suitably used as a circuit board material.

In view of desired heat resistance and processability of the film, the melting point (Tm) of the TLCP film may be selected in a range from about 200° C. to 400° C., preferably about 250° C. to 360° C., more preferably about 260° C. to 350° C. (for example, 260° C. to 340° C.). It should be noted that the melting point of the film can be determined by observing the thermal behavior of the film using a differential scanning calorimeter. That is, a test film is heated at a rate of 20° C./min to completely melt the film, and the melt is rapidly cooled or quenched to 50° C. at a rate of 50° C./min. Subsequently, the quenched material is reheated at a heating rate of 20° C./min., and a position of an endothermic peak appearing in the reheating process may be recorded as a melting point of the film.

The TLCP film used in the present invention may have any thickness. Where the TLCP film is used in a high-frequency transmission line, the TLCP film may have a thickness as thick as possible because usage of a thicker film can reduce transmission loss. Where a TLCP film is used as an electrically insulating layer, the film may preferably have a thickness in a range from 10 to 500 μm, and more preferably in a range from 15 to 200 μm. Since a film having too small thickness has small rigidity and poor strength, it is possible to achieve a desired thickness by laminating the films having a thickness in a range from 10 to 200 μm.

Degassing Process

Thus-obtained TLCP films are subjected to a degassing process for removing air or moisture present in and/or on the film.

Degassing process may be carried out in the production of a TLCP film having improved thermo-adhesiveness, and/or may be carried out as one of the processes during the production of a circuit board.

Degassing process enables to improve the thermo-adhesiveness of the TLCP film, and also enables to enhance interlayer adhesion between the TLCP film and an adherend.

The TLCP film subjected to the degassing process may have any shape as long as degassing of the TLCP film is possible. For example, in the degassing process, the TLCP film may be prepared as a sheet material that may be provided with a conductor layer; as a multi-layer laminate (for example, a multi-layer laminate comprising a plurality of film layers each of which may be provided with a conductor layer); or as a product in roll form.

For example, where a product in roll form is used, the product in roll form may be prepared by winding a film onto a tubular core in a known or conventional manner. FIG. 1 is a schematic view for explaining a product in roll form comprising a TLCP film. As shown in FIG. 1, a rolled product 1 is formed by winding a TLCP film 3 onto a tubular core 2.

The product in roll form, for example, as shown in FIG. 1, may have a winding thickness (W) of 1000 mm or smaller, for example, about 10 to 900 mm, preferably 800 mm or smaller, and more preferably 600 mm or smaller.

The degassing of the TLCP film can be carried out by degassing the TLCP film under a certain vacuum condition (for example, a vacuum drying) and/or degassing under heat condition (for example, a heat drying) to reduce air and moisture on and/or in the TLCP film to an extremely low level. As a result, surprisingly, the TLCP film that has undergone such a degassing process can improve the thermo-adhesive property.

For example, although the present invention does not exclude the softening process, such TLCP films can achieve enhanced adhesive property even without softening treatment such as destruction of the skin layer in the TLCP film. If desired, a surface treatment such as softening treatment may be carried out for TLCP films.

In the degassing process, degassing of the TLCP film can be carried out (i) by degassing under vacuum of 1500 Pa or lower for 30 minutes or more, and/or (ii) by degassing under heating at a temperature ranging from 100° C. to 200° C.

The degassing process may be carried out in a condition satisfying either degassing (i) under vacuum, or degassing (ii) under heating, preferably in a condition satisfying both (i) and (ii).

The degassing condition where both (i) and (ii) are satisfied may be a condition where both (i) and (ii) are satisfied at the same time, i.e., degassing a TLCP film by heating at a specific temperature under a specific vacuum degree (vacuum pressure). Alternatively, the degassing condition where both (i) and (ii) are satisfied may be a condition where (i) and (ii) are carried out separately, i.e., degassing a TLCP film in the order of from (i) to (ii) or in the order of from (ii) to (i).

It should be noted that where degassing process (i) and (ii) are carried out separately, another process might be inserted within a range not adversely affecting the film, between the degassing (i) and (ii) or between the degassing (ii) and (i).

Moreover, from the viewpoint of improving degassing efficacy, degassing may be carried out without substantial pressurization (under pressure release). For example, degassing may be carried out under a minimum pressure or pressure-released state (for example, under a compression pressure of about 0 to 0.7 MPa, preferably under a compression pressure of about 0 to 0.5 MPa).

Degassing under vacuum (i) may be carried out at a vacuum degree of 1500 Pa or lower, preferably 1300 Pa or lower, and more preferably 1100 Pa or lower.

Where degassing under vacuum is performed independently, degassing may be carried out at an ambient temperature (for example, from 10° C. to 50° C., preferably from 15° C. to 45° C.). In view of enhancing the degassing efficiency, degassing may be carried out under heating, for example, at a heating temperature ranging from 50° C. to 200° C. (for example, from 50° C. to 150° C.), preferably from 80° C. to 200° C., and more preferably from about 90° C. to about 190° C.

Degassing under heating (ii) may be carried out in a range from 100° C. to 200° C., preferably from 105° C. to 190° C., and more preferably from 110° C. to 180° C.

Degassing temperature under heating may be set in a predetermined temperature range with respect to a melting point (Tm) of the TLCP film. Degassing may be carried out by heating at a temperature ranging from (Tm−235) ° C. to (Tm−50) ° C. [e.g., from (Tm−200) ° C. to (Tm−50) ° C.], preferably, from (Tm−225) ° C. to (Tm−60) ° C. [e.g., from (Tm−190) ° C. to (Tm−60) ° C.], and more preferably from (Tm−215) ° C. to (Tm−70) ° C. [e.g., from (Tm−180) ° C. to (Tm−70) ° C.].

By heating the TLCP film in a specific temperature range as described above, while suppressing rapid moisture generation from the film, the moisture in the film (for example, inside or on a surface of the film) can be degassed as water vapor, or the air on the surface of the film can be degassed by enhancing kinetic energy of the air.

It should be noted that where degassing under heating is carried out independently, the degassing might be carried out under a condition that does not contain the vacuum condition of 1500 Pa or lower. For example, degassing may be carried out by heating under an atmospheric pressure (or ambient pressure) where the pressure is not specifically adjusted. Alternatively, if necessary, degassing may be carried out by heating under a reduced pressure from the atmospheric pressure (for example, beyond 1500 Pa and less than 100000 Pa, preferably about 3000 to 50000 Pa).

The period of time required for degassing procedure may be suitably set depending on various conditions such as a state of the TLCP film, a vacuum degree, and/or a heating temperature. In view of removing moisture and air from the entire TLCP film, the period for degassing for the degassing process (i) and/or the degassing process (ii) (i.e., under vacuum, under heating, under vacuum while heating) may be same or different. The degassing period may be 30 minutes or more, 40 minutes or more, or 50 minutes or more. The degassing period may be 6 hours or less, 4 hours or less, 3 hours or less, 2 hours or less, or 1.5 hours or less.

Alternatively, the degassing period may be set appropriately depending on the moisture content in the TLCP film, for example, may be carried out until the TLCP film has a desired moisture content range to be described later (for example, 300 ppm or less, or 200 ppm or less).

As described above, where degassing under vacuum (i) and degassing under heating (ii) are carried out in combination to the extent that thermo-adhesiveness of the TLCP film is capable of being increased, the degassing processes (i) and (ii) may be carried out in any order, preferably carried out by degassing under heating (ii) as a first degassing, followed by degassing under vacuum (i) as a second degassing.

Specifically, for example, degassing process may comprise a first degassing process in which degassing of the circuit board materials is carried out under heating at a temperature ranging from 100° C. to 200° C. for a predetermined time, and a second degassing process in which degassing of the circuit board materials is carried out under vacuum of 1500 Pa or lower for another predetermined time. These degassing processes may be appropriately carried out by combining the above-mentioned conditions.

TLCP Film Having Improved Thermo-Adhesiveness

By carrying out such a degassing process, surprisingly, a TLCP film having enhanced thermo-adhesive property can be obtained. Although the reason for this achievement is not clear, the following mechanism is presumed. Since the TLCP film is excellent in gas barrier property, there is a possibility that the TLCP film itself may suppress escape of moisture from the film once the moisture is contained inside, as well as may suppress escape of air from the film where the TLCP film absorbs the air on the surface.

Further, there is another possibility described as follows. The main component of the gas released from the resin is water vapor in general. The water vapor volume becomes several thousand times when water is converted to vapor. In the meantime, as the vacuum status proceeds, moisture can be hardly released from inside of the film after reaching equilibrium of the emission amount from the resin and the emission amount of the vacuum pump. Accordingly, where thermo-compression bonding is carried out under vacuum, the water molecules contained inside of the film may be hardly released.

Where the film itself is a source for generating the air and the moisture, local adhesion failure (local delamination) between bonded layers may occur due to the air and the moisture remained in the film or on the surface of the film in the lamination process for the circuit board production.

Further, the TLCP film obtained by a specific degassing method can achieve an extremely low moisture content while maintaining isotropic property of the polymer.

The TLCP film obtained by the degassing process has a Segment Orientation Ratio SOR of 0.8 to 1.4, and a moisture content of 300 ppm or less.

The moisture content may be preferably 200 ppm or less, more preferably 180 ppm or less, and even more preferably 150 ppm or less. Here, the moisture content indicates a value measured by the method described in Examples below.

The Segment Orientation Ratio SOR as an indicator of isotropic property of the film is 0.8 to 1.4, and may be preferably 0.9 to 1.3, more preferably 1.0 to 1.2, and particularly preferably 1.0 to 1.1.

Here, the Segment Orientation Ratio SOR is an index descriptive of a degree of molecular orientation, and represents, unlike the standard MOR (Molecular Orientation Ratio), a value that takes the thickness of an object into consideration.

Since the film is isotropic, the film may preferably have a dimensional stability in the MD and TD directions of within ±1%, more preferably within ±0.5%, and more preferably within ±0.1%. Here, the dimensional stability may be a value measured in accordance with IPC-TM-6502.2.4.

The obtained TLCP film may be used as an insulating substrate layer of a unit circuit board comprising a conductor layer formed on one or both sides of the insulating substrate layer. Alternatively, the TLCP film may be used as an adhesive material (for example, a bonding sheet and a coverlay) for bonding to a conductor layer(s).

The TLCP film may have a dielectric loss tangent at 25 GHz of, for example, 0.0025 or less (e.g., about 0.0001 to 0.0023), and preferably about 0.0010 to 0.0022. The TLCP film having such a dielectric loss tangent enables to lower power consumption as well as to reduce noise.

The relative dielectric constant of the TLCP film varies depending on the thickness of the film. The TLCP film may have a relative dielectric constant at 25 GHz in the TD direction, for example, of 3.25 or less (e.g., about 1.8 to 3.23), and preferably about 2.5 to 3.20. It should be noted that the dielectric constant can be generally calculated by multiplying the vacuum dielectric constant ($=8.855 \times 10^{-12}$ (F/m)) to relative dielectric constant.

For example, the dielectric constant measurement may be carried out by a resonance perturbation method at a frequency of 10 GHz. Where a 1 GHz cavity resonator (manufactured by Kanto Electronic Application and Development Inc.) is connected to a network analyzer ("E8362B", manufactured by Agilent Technologies, Inc.), and a small sample (width: 2.7 mm×length: 45 mm) is inserted into the cavity resonator, the dielectric constant and the dielectric loss tangent of the sample can be measured from the change in resonance frequency before and after inserting the material to expose the material to an environment at a temperature of 20° C. and a humidity of 65% (RH) for 96 hours.

The present invention may also embrace a packaged TLCP film product. The packaged TLCP film product may comprise the TLCP film having thermo-adhesive property and a gas barrier packaging material packing the TLCP film inside. In this case, the TLCP film is packed with the packaging material having a gas barrier property.

The packaged TLCP film product makes it possible to transport or convey a degassed TLCP film with maintaining the degassed state since the TLCP film is packed with a gas barrier packaging material.

The shape of the TLCP film may be any shape such as a sheet material as described above, a multilayer laminate, and a product in roll form (rolled product). If necessary, a conductor layer or a conductive layer may be formed on the TLCP film.

From the viewpoint of portability, the TLCP film to be packed in the packaged product may be preferably in roll form.

The gas barrier packaging material may have, for example, a moisture permeability of 10 $g/m^2$/day or less (e.g., 0.5 to 10 $g/m^2$/day), preferably 8 $g/m^2$/day or less, and more preferably 6 $g/m^2$/day or less.

Furthermore, the gas barrier packaging material may have, for example, an oxygen permeability of 10 $mL/m^2$/day/MPa or less (for example 0.5 to 10 $mL/m^2$/day/MPa), preferably 8 $mL/m^2$/day/MPa or less, and more preferably 5 $mL/m^2$/day/MPa or less.

As the gas barrier packaging material, there may be exemplified various gas barrier films, and a laminate of a gas barrier film with a CLAF, a paper, and/or a non-woven fabric.

Examples of the gas barrier films may include various types of films such as an aluminum foil-laminated film, an aluminum-evaporated film, a silica-evaporated film, a polyvinylidene chloride-coated film and other gas barrier films. The gas barrier film may have a substrate film such as a polyester film, a polyethylene film, and a polypropylene film.

Furthermore, the outside of these films and/or laminates may be further packed with a paper or others; and/or these films and/or laminates may be housed in a carton box, a crate, a metal case, a pedestal and others.

Method for Producing Circuit Board

As one embodiment of the present invention, there may be mentioned a method for producing a circuit board having an improved interlayer adhesion even without an adhesive agent.

The producing method at least includes:

preparing a plurality of circuit board materials;

stacking the prepared circuit board materials in accordance with a predetermined structure of a circuit board to obtain a stacked material, followed by conducting thermo-compression bonding of the stacked material by heating under a predetermined compression pressure; wherein the prepared circuit board materials are at least one member selected from the group consisting of an insulating substrate having a conductor layer (e.g., a conductor circuit or a conductor pattern, a conductor foil, a conductor film) on at least one surface, a bonding sheet, and a coverlay, and (I) at least one of the prepared circuit board materials comprises a degassed thermoplastic liquid crystal polymer film subjected to the above-mentioned degassing, and/or (II) at least one of the prepared circuit board materials comprises a non-degassed thermoplastic liquid crystal polymer film, and the above-mentioned degassing process is conducted after the preparation of the circuit board materials and before the thermo-compression bonding.

That is, in the method for producing a circuit board of the present invention, the interlayer adhesion of the circuit board can be improved by carrying out the following process (I) and/or process (II).

In the process (I), a degassed TLCP film is prepared as a TLCP film in a preparation process.

In the process (II), a specific degassing process to degas a TLCP film is carried out after preparation of the circuit board materials and before thermo-compression bonding.

Preparation of Circuit Board Materials

In the preparation process, a plurality of circuit board materials (or insulating substrate materials), are prepared. The circuit board materials can comprise at least one member selected from the group consisting of an insulating substrate, a bonding sheet, and a coverlay, where the insulating substrate having a conductor layer (e.g., a conductor circuit or a conductor pattern, a conductor foil, a conductor film) on at least one surface.

In the preparation, the prepared circuit board materials may be, for example, a plurality of insulating substrates each having a conductor layer on at least one surface; alternatively, may be a combination of (i) an insulating substrate having a conductor circuit on at least one surface and (ii) at least one circuit board material selected from the group consisting of a bonding sheet and a coverlay.

As described above, in the process (I), at least one member selected from the group consisting of an insulating substrate, a bonding sheet, and coverlay may comprise a degassed TLCP film having an improved thermo-adhesiveness. By using such a TLCP film having an improved thermo-adhesiveness; it is possible to improve the interlayer adhesion of the circuit board even carrying out a conventional thermo-compression bonding process for producing a circuit board.

As the insulating substrate, there may be mentioned various organic materials and inorganic materials used in the conventional circuit board. Examples of the organic materials may include a thermoplastic liquid crystal polymer, a polyimide, a cycloolefin polymer, a fluorine resin, an epoxy resin, a phenolic resin and an acrylic resin, and other organic materials. Examples of the inorganic materials may include a ceramic, and the like. These materials may be used in the circuit board singly or in combination of two or more. Of these, from the viewpoint of high-frequency characteristics and dimensional stability, the TLCP insulating substrate is preferred.

Examples of the insulating substrates each having a conductor layer on at least one surface may include:

a unit circuit board comprising an insulating substrate and a conductor circuit or pattern formed on one surface of the insulating substrate;

a unit circuit board comprising an insulating substrate and conductor circuits or patterns formed on both surfaces of the insulating substrate;

a unit circuit board comprising an insulating substrate, a conductor circuit or pattern formed on one surface of the insulating substrate, and a conductor film or foil formed on the other surface of the insulating substrate;

a conductor-clad laminate comprising an insulating substrate and a conductor film or foil formed on one surface of the insulating substrate; and a conductor-clad laminate comprising an insulating substrate and conductor films or foils formed on both surfaces of the insulating substrate.

Conductor Layer

The conductor layer can be at least formed for example from a conductive metal. By using a known circuit processing method, the conductor layer may be formed into any pattern of circuits. As the conductor for forming a conductor layer, there may be mentioned various metals having conductivity, such as gold, silver, copper, iron, nickel, aluminum, and an alloy metal thereof.

Any known method may be used as a method for forming a conductor layer on an insulating substrate of a TLCP film. For example, a metal layer may be formed by evaporation, electroless plating, and/or electrolytic plating. Alternatively, a metal foil (for example, copper foil) may be thermo-compression bonded on the surface of the TLCP film.

The metal foil constituting the conductor layer may be preferably a metal foil used in electrical connections. Examples of the metal foils may include a copper foil, as well as various metal foils such as gold, silver, nickel, aluminum foils, and also an alloy foil comprising these metals in a substantial manner (for example, 98% by weight or greater).

Of these metal foils, a copper foil can be preferably used. The species of the copper foil is not particularly limited, and can be any of copper foil usable in the circuit board, for example, a rolled copper foil or an electrolytic copper foil.

From the viewpoint of improvement in solder heat resistance and interlayer adhesion, it is preferable that the conductor layer has a smooth surface.

Preferably, the conductor layer may have a surface roughness ($Rz_{JIS}$) of 1.25 μm or less, preferably 1.2 μm or less, and more preferably 1.15 μm or less as an average value of ten-points measured according to a method conforming to ISO4287-1997. The lower limit of $Rz_{JIS}$ is not particularly limited, and for example, may be about 0.5 μm.

The conductor layer may have an arithmetic mean roughness of, for example, 0.15 μm or less, or 0.14 μm or less measured according to the method conforming to ISO4287-1997 (Ra). The lower limit of Ra is not particularly limited, and for example, may be about 0.05 μm, or may be about 0.11 μm.

In the above configuration, it may be possible for a conductive layer on the TLCP film to have a smooth surface even where the conductive layer is not adhered to another layer in the lamination for obtaining a laminate. It should be noted that where the conductor layer is processed into circuits, it might be sufficient for the remained part of the conductor layer (i.e., circuit part) to have a smooth surface.

The conductor layer may preferably have a thickness of, for example, 1 to 50 μm (e.g., about 5 to 50 μm), and more preferably of 8 to 35 μm (e.g., 10 to 35 μm).

The conductor layer may contain an oxidation-resistant coat on the surface. The surface treatment of the conductor layer makes it possible to form an alloy layer on the surface of the conductor layer, the alloy layer having a higher oxidation resistance than the conductor layer body itself. The conductor layer having such an oxidation-resistant coat can advantageously prevent deterioration of the conductor layer due to oxidation of the conductor surface during the degassing process. It is also expected to achieve a further improvement in adhesion due to the alloy layer.

For example, the preparation process of the unit circuit board may comprise:

thermo-compression bonding of a metal foil(s) to a TLCP film on one or both surfaces of the TLCP film; and forming an oxidation-resistant coat on the surface of the metal foil(s).

The preparation process of the unit circuit board may further include applying or attaching a silane-coupling agent on the conductor layer surface.

As the oxidation-resistant coat, there may be exemplified an oxidation-resistant alloy layer, an oxidation-resistant plating layer, an anticorrosive agent layer such as a benzotriazole-coating layer, and other oxidation-resistant layer.

It should be noted that depending on the type of the conductor layers and oxidation resistant coat, the oxidation-resistant coat might be formed either before or after processing circuits.

For example, if the conductor layer comprises a thermo-compression bonded metal foil, the oxidation-resistant alloy layer may be preferably formed from an alloy metal including at least the metal constituting the metal foil in order to enhance adhesive property. For example, where the metal foil constituting the conductor layer is a copper foil, an alloy layer may be an alloy at least containing copper. For example, an oxidation-resistant alloy layer may be preferably formed before processing circuits.

For example, such an alloy layer may be formed using "FlatBOND GT" manufactured by MEC Co., Ltd.

It should be noted that, there might be an alloy portion existing apart from the copper foil, the alloy portion containing no copper. Such an alloy portion without copper may be etched with an etching liquid. As such an etching solution, there may be used, for example "MEC REMOVER S-651A" (produced by MEC Co., Ltd.), "S-BACK H-150" (produced by SASAKI CHEMICAL CO., LTD.), an aqueous solution containing an inorganic acid such as nitric acid, and the like.

From the viewpoint of improving adhesive property of the conductor layer, a known or conventional silane-coupling agent may be applied or attached to the surface of the conductor layer (in particular the alloy layer). Application of the silane-coupling agent to the alloy layer surface can further improve bonding strength between the conductor layer and the TLCP film. Even without forming uneven surface exerting an anchoring effect on the surface of the conductor layer, it is possible to achieve a bonding strength indicated by a high peel strength by the thermo-compression while maintaining the smooth surface of the conductor layer in the thermo-compression bonding.

Bonding Sheet and/or Coverlay

As an adhesive circuit board material used for adhering to the conductor layer, one or more circuit board materials (adhesive materials) may be prepared in addition to the unit circuit board. The adhesive material may be preferably a TLCP film. Examples of the adhesive materials may include at least one selected from a bonding sheet and a coverlay. It should be noted that the coverlay is typically used to cover the conductor layer as an outermost layer, and that the bonding sheet is typically used to bond the circuit board materials. The bonding sheet and/or the coverlay may be composed of a TLCP film. Preferably, at least one selected from the bonding sheet and the coverlay may be composed of a TLCP film having an improved thermo-adhesive property.

For example, where a TLCP film subjected to degassing process is referred to as an adhesion-improved LCP film, and a TLCP film not subjected to degassing process is referred to as an un-degassed LCP film, a combination of suitable circuit board materials may be exemplified as follows:

(a) a circuit board including an un-degassed LCP film as an insulating substrate and an adhesion-improved LCP film as a bonding sheet, and optionally an un-degassed LCP film as a coverlay;

(b) a circuit board including an un-degassed LCP film as an insulating substrate and an adhesion-improved LCP film as a bonding sheet, and optionally an adhesion-improved LCP film as a coverlay;

(c) a circuit board including an adhesion-improved LCP film as an insulating substrate and an un-degassed LCP film as a bonding sheet, and optionally an un-degassed LCP film as a coverlay;

(d) a circuit board including an adhesion-improved LCP film as an insulating substrate and an adhesion-improved LCP film as a bonding sheet, and optionally an un-degassed LCP film as a coverlay;

(e) a circuit board including an adhesion-improved LCP film as an insulating substrate and an adhesion-improved LCP film as a bonding sheet, and optionally an adhesion-improved LCP film as a coverlay;

(f) a circuit board including an adhesion-improved LCP film as an insulating substrate and an un-degassed LCP film as a coverlay;

(g) a circuit board including an un-degassed LCP film as an insulating substrate and an adhesion-improved LCP film as a coverlay;

(h) a circuit board including an adhesion-improved LCP film as an insulating substrate and an adhesion-improved LCP film as a coverlay;

(i) a circuit board including an adhesion-improved LCP film as a first insulating substrate, an adhesion-improved LCP film as a second insulating substrate, and optionally an un-degassed LCP film as a coverlay;

(j) a circuit board including an adhesion-improved LCP film as a first insulating substrate, an adhesion-improved LCP film as a second insulating substrate, and optionally an adhesion-improved LCP film as a coverlay; and other combinations.

Where the degassing process is carried out in the producing process of the circuit board, since the specific degassing process provides LCP films with improved thermo-adhesive property, an un-degassed LCP film can be used as any of the prepared the circuit board material such as an insulating substrate, a bonding sheet, and a coverlay.

In the circuit board comprising the circuit board materials, the circuit board materials may comprise at least two TLCP films including a first TLCP film and a second TLCP film, wherein a conductor layer is interposed between the first TLCP film and the second TLCP film. In such a case, the difference in melting point between the first TLCP film and the second TLCP film may be in a range of, for example, 0° C. to 70° C., and preferably about 0° C. to 60° C. (for example, about 10° C. to 50° C.).

For example, the first LCP film may be a high-melting-point LCP film having higher heat resistance, and the second LCP film may be a low-melting-point LCP film having lower heat resistance than the first LCP film. For example, at least two circuit board materials selected from an insulating substrate, a bonding sheet and a coverlay may comprise a combination of a high-melting-point LCP film having higher heat resistance (for example, melting point of about 300° C. to 350° C.) and a low-melting-point LCP film having lower heat resistance (for example, melting point of about 250° C. to 300° C.).

Further, since the circuit board according to the present invention is excellent in interlayer adhesion, for example, the circuit board materials adhered to each other may be composed of high-melting-point LCP films, alternatively may be composed of low-melting-point LCP films. In this case, the difference in melting point between high-meltingpoint LCP films or between low-melting-point LCP films may be, for example, about 0° C. to 20° C., and preferably about 0° C. to 10° C.

Alternatively, the adjacent circuit board materials adhered to each other may comprise a combination of a high-melting-point LCP film and a low-melting-point LCP film. In this case, the difference in melting point between LCP films may be, for example, exceeding 20° C., and preferably 30° C. to 70° C.

The adhesion-improved LCP film can be used as the high-melting-point LCP film or can be used as the low-melting-point LCP film. Among the adjacent LCP films adhered to each other (for example, a combination of a high-melting-point LCP film and a high-melting-point LCP film, a combination of a low-melting-point LCP film and a low-melting-point LCP film, a combination of a high-melting-point LCP film and a low-melting-point LCP film), at least one LCP film in the combination may be an adhesion-improved LCP film; preferably both of the LCP films in the combination may be adhesion-improved LCP films. Alternatively, at least the low-melting-point LCP film in the combination may be an adhesion-improved LCP film.

Depending on the configuration of the circuit board, the melting point of the LCP film used as an adhesive material may be identical to the melting point of the substrate of the unit circuit board. Alternatively, the LCP film used as an adhesive material may have a lower melting point than a LCP film constituting the unit circuit board. In that case, the difference in melting point between the LCP films may be, for example, about 0° C. to 70° C., and more preferably about 0° C. to 60° C.

It should be noted that within the range that does not impair the effects of the present invention, the surface treatment might be performed on the circuit board material (in particular on the LCP film). The surface treatment can be carried out, for example, by known methods such as ultra-violet irradiation, plasma irradiation, and physical polishing.

Degassing Process

By carrying out the above-mentioned degassing process in the production method of a circuit board, the TLCP film may have improved adhesiveness.

The degassing process in the production method may be carried out before the thermo-compression bonding process, or after the preparation process and before the thermo-compression bonding process.

Where the degassing process is carried out in the method for producing a circuit board, preferably the degassing process may comprise:

a first degassing of the circuit board materials under heating at a temperature ranging from 100° C. to 200° C. for a predetermined time; and a second degassing of the circuit board materials under vacuum of 1500 Pa or lower for another predetermined time.

Furthermore, degassing process may be carried out as a pre-heating process prior to the thermo-compression bonding. The pre-heating process may be carried out, for example, in a heating temperature range from 50° C. to 150° C. under vacuum of 1500 Pa or lower. The heating temperature during the pre-heating process may be preferably about 60° C. to 120° C., and more preferably 70° C. to 110° C.

Such a pre-heating process makes it possible to remove air and/or moisture on and/or in the LCP film to some extent, even if an un-degassed film is used as the circuit board materials. As a result, it is possible to improve the interlayer adhesion between the LCP film and an adherend even without an adhesive agent.

The pre-heating process may be carried out under a vacuum degree of 1500 Pa or less, preferably 1300 Pa or less, and more preferably 1100 Pa or less.

During the pre-heating process, a compression pressure may be applied to the circuit board material within a range that does not inhibit the effect of the invention. The compression pressure in the pre-heating process may be, for example, 0.8 MPa or less, and more preferably 0.6 MPa or less. The pre-heating process may be preferably carried out with applying a compression pressure as low as possible, preferably substantially without applying a compression pressure.

The pre-heating process may be carried out, for example, for about 30 to 120 minutes, preferably about 40 to 100 minutes, and more preferably about 45 to 75 minutes.

For example, where the first degassing process is combined with the second degassing process, the degassing process may be carried out as follows:

First Degassing Process: Degassing Under Heating

In order to avoid gas discharge in the lamination process for producing a circuit board or post-process thereafter, degassing can be carried out. Without degassing process, a gaseous compound may be discharged from LCP films used for a circuit board material or adhesive material, as well as from metal layer of the conductor layer. The degassing process may be carried out by preliminarily degassing a unit circuit board(s) as well as a LCP film(s) used for the adhesive material under heating, for example, at atmospheric pressure (or ambient pressure).

The heating may be carried out at a temperature ranging from 100° C. to 200° C., preferably of 110° C. to 190° C. The heating time can be adjusted appropriately depending on the heating temperature, and may be, for example, 30 minutes to 4 hours, and preferably 1 hour to 3 hours.

The degassing under heating may be conducted under conditions that do not contain a vacuum degree of 1500 Pa or less, for example, may be carried out under an atmospheric pressure (or normal pressure) without adjusting the pressure. If desired, the degassing under heating may be conducted under a pressure reduced from the atmospheric pressure (e.g., beyond 1500 Pa and less than 100000 Pa, preferably about 3000 to 50000 Pa).

Incidentally, in order to prevent oxidation of conductors (such as copper foil); it is preferable to heat under an inert gas atmosphere such as nitrogen in the first degassing process. Alternatively, such a heating may be carried out in the state that the conductor has an oxidation-resistant coat (e.g., oxidation-resistant alloy layer, oxidation resistant plating layer, anti-rust inhibitor layer such as benzotriazole-coated layer) on the surface.

Second Degassing Process: Enhanced or Intensified Degassing

Subsequently, further degassing of LCP films used for the unit circuit board and the adhesive material may be preferably carried out under vacuum. This degassing process (second degassing process) may be performed at a vacuum degree of 1500 Pa or less, preferably 1300 Pa or less, and more preferably 1100 Pa or less. The degassing period can be adjusted appropriately according to the vacuum degree, for example 30 minutes or more, 40 minutes or more, or 50 minutes or more. The degassing period may be 6 hours or less, 4 hours or less, and 3 hours or less, 2 hours or less, or 1.5 hours or less.

The degassing under vacuum may be carried out at an ambient temperature (e.g., in a range from 10° C. to 50° C., preferably 15° C. to 45° C.), alternatively may be carried out under heating in view of increasing degassing efficiency.

Where heating the LCP films, the heating temperature may be in a range from 80° C. to 200° C., preferably 100° C. to 200° C., and more preferably 115° C. to 200° C. As described above, by heating the LCP film at a certain temperature lower than the melting point of the film, it is possible to carry out degassing water in the film as the water vapor while suppressing the rapid moisture generation from the film.

The second degassing process, from the viewpoint of improving the degassing, may be carried out substantially without pressurization (carried out under pressure release). For example, where a circuit board is produced using a vacuum hot press apparatus; a unit circuit board(s) and a LCP film(s) for an adhesive material(s) are degassed in the first degassing process, and then the unit circuit board(s) and the adhesive material(s) may be set with stacking one another to obtain a stacked material to be subjected to a second degassing process without pressurization.

Such a degassing process(es) makes it possible to obtain an LCP film having extremely low moisture and air contents as the substrate material, resulting in prevention of local adhesion failure that is caused by air introduction in a multilayer-laminated body due to insufficient degassing. In particular, according to the present invention, the multilayer circuit board, even having many layers, can avoid insufficient degassing of a film(s) that exist(s) in the center portion of the multilayer circuit board.

Thermo-Compression Bonding Process

In the thermo-compression bonding process, the circuit board materials prepared in the preparation process are stacked (overlaid) in accordance with a predetermined circuit board structure, and the stacked circuit board materials are thermo-compression bonded by heating at a predetermined pressure.

The circuit board structure to be laminated is not particularly limited, and may have appropriately determined according to the desired structure. The circuit board materials are usually stacked so that a conductor layer (or a conductor circuit) is interposed between the circuit board materials.

It should be noted that the circuit board materials need only to be in a stacked structure in the thermo-compression bonding process. The circuit board materials may be stacked at any time, depending on the state of the prepared circuit board materials and work procedures, for example, may be stacked in the process such as preparation process, degassing process, and thermo-compression bonding process.

Stacking may be carried out, for example, by sandwiching a bonding sheet between at least two sheets of insulating substrates each having a conductor circuit on at least one surface, and optionally by arranging a coverlay on an outermost surface of a stacked body. Alternatively, stacking may be carried out by superposing, without a bonding sheet, at least two sheets of insulating substrates each having a conductor circuit on at least one surface, and optionally by placing a coverlay on an outermost surface of a stacked body. Where the insulating substrates can be directly bonded without a bonding sheet, the thickness of the entire circuit board can be reduced.

Thermo-compression bonding of a stacked body can be carried out by using a vacuum hot press apparatus, a heating roll lamination equipment, or others, depending on the type of circuit board materials. From the viewpoint of reducing further gas from the LCP film, it is preferable to use a vacuum hot press apparatus. For example, the vacuum hot press may be preferably carried out by thermo-compression bonding, while maintaining the degassed state of the stacked structure achieved by vacuum degassing. The vacuum degree during thermo-compression bonding may be preferably maintained in the same degree with the vacuum degree of the second degassing process (e.g., 1500 Pa or below).

Where using a TLCP film that has a thermo-adhesive property enhanced by degassing process, the heating temperature in the thermo-compression bonding may be a temperature selected from a broad temperature range, for example, from (Tm−60) ° C. to (Tm+40) ° C., preferably from (Tm−55) ° C. to (Tm+30) ° C., and more preferably from (Tm−50) ° C. to (Tm+25) ° C., where Tm denotes the melting point of the adhesion-improved TLCP film to be bonded (in particular, where TLCP films each having different melting point with each other, Tm denotes a lower (lowest) melting point of the films). For example, where thermo-compression bonding is carried out at a high temperature environment, the heating temperature may be in a range from (Tm−20) ° C. to (Tm+40) ° C., (e.g., (Tm−20) ° C. to (Tm+20) ° C., preferably about (Tm−10) ° C. to (Tm+30) ° C., and more preferably about (Tm−10) ° C. to (Tm+10) ° C.

According to the present invention, where the degassing processes (i) and (ii) are combined, surprisingly, it is possible to achieve good interlayer adhesion even by heating at a temperature lower than the melting point of the adhesion-improved TLCP film to be adhered. The thermo-compression bonding may be carried out at a temperature for example, (Tm−60) ° C. or higher and lower than (Tm−20) ° C., (Tm−50) ° C. or higher and lower than (Tm−30) ° C., and more preferably (Tm−40) ° C. to (Tm−32) ° C.

Also, the pressure applied during thermo-compression bonding can be selected, depending on the LCP film characteristics, for example, from a wide range from 0.5 to 6 MPa. According to the present invention, since an adhesion-improved LCP film(s) undergone the degassing process is(are) used for bonding, good adhesion between LCP film layers can be achieved even at a pressing pressure of 5 MPa or less, particularly 4.5 MPa or less (for example, 0.5 to 3 MPa, preferably, 1 to 2.5 MPa), resulting in avoidance of local adhesion failure caused by air introduction in a circuit board even after bonding.

According to the present invention, where the degassing process (i) and (ii) are combined, the thermo-compression bonding process may include a thermo-compression bonding at a low pressing pressure. For example, thermo-compression bonding process may be carried out under a low pressure, for example, in a pressing pressure range from 0.5 to 2.5 MPa, preferably 0.6 to 2 MPa, and more preferably 0.7 to 1.5 MPa.

Further, according to the present invention, thermo-compression bonding may be carried out in a single-stage pressing, or in a multi-stage pressing such as two-stage pressing. For example, a two-stage pressing may be carried out by pressing under a higher compression pressure (for example, a range of beyond 2.5 MPa and less than 5 MPa) so as to conduct a temporary bonding as a pre-process of the thermo-compression bonding, followed by pressing under the above-described lower compression pressure. Thermo-compression bonding under the lower compression pressure may be carried out in a longer time than thermo-compression bonding time of under the higher compression pressure. Thermo-compression bonding under the low compression pressure may be carried out at a higher temperature than the thermo-compression bonding temperature under the higher compression pressure.

The time required for the thermo-compression bonding (retention time under a constant temperature and pressure) is not particularly limited as far as the circuit board can have an improved interlayer adhesion, and for example, may be about 15 to 60 minutes, preferably about 20 to 50 minutes, and more preferably about 20 to 40 minutes. In the case where the multi-stage pressing is carried out, the thermo-compression bonding time may be the total time of each of the retention times.

It should be noted that the method for producing the circuit board might include, if necessary, various producing processes that are known or conventional (e.g., circuit formation process, through-connection process, interlayer connection process).

The method for producing a circuit board according to preferable one embodiment may include:

preparing at least one unit circuit board and at least one TLCP film as a circuit board material to be adhered to the unit circuit board, the unit circuit board comprising a thermoplastic liquid crystal polymer film and a conductor layer formed on one or the both surfaces of the thermoplastic liquid crystal polymer film, and the circuit board material being adhered to the surface of the conductor layer;

performing a first degassing of the unit circuit board(s) and the circuit board material(s) under heating at a temperature ranging from 100° C. to 200° C. for a predetermined period of time, for example, under the ambient pressure;

performing a second degassing the of the unit circuit board(s) and the circuit board material(s) under vacuum of 1500 Pa or lower;

performing integration of a stacked material formed by stacking the at least one circuit board material and the at least one unit circuit board by thermo-compression bonding by application of heat and pressure to the stacked material, wherein the surface of the conductor layer in contact with the circuit board material has a surface roughness ($Rz_{JIS}$) of 1.25 μm or less as an average value of ten-points measured according to a method conforming to ISO 4287-1997.

Hereinafter, with reference to the drawings, as an embodiment according to the present invention, there may be mentioned a method for producing a circuit board (laminating insulating substrates without a bonding sheet) as well as a method for producing a circuit board (laminating insulating substrates with a bonding sheet in between). It should be noted that the scope of the present invention is not limited to these embodiments.

Figure 2A:
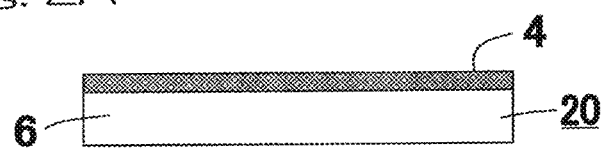
FIGS. 2A and 2B are schematic cross-sectional views for explaining a production process of a circuit board according to an embodiment of the present invention, and show states before and after lamination, respectively.
Figure 2A:
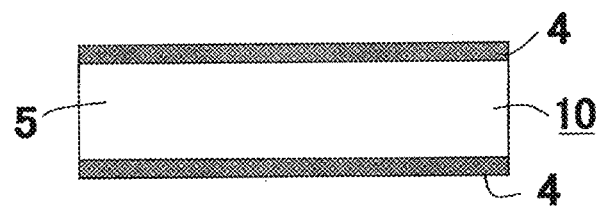

FIG. 2A is a schematic sectional view showing a circuit board without a bonding sheet in a state before insulating substrates are stacked. Here are prepared a first unit circuit board (double-sided copper-clad laminate) 10 that comprises a first TLCP film 5 and copper foils 4,4 cladded on both surfaces of the film 5; and a second unit circuit board (single-sided copper-clad laminate) 20 that comprises a second TLCP film 6 and a copper foil 4 cladded on one surface of the film 6. Here the first TLCP film 5 and the second TLCP film 6 may be made of the same material, and may have thicknesses being identical or different with each other.

Then a circuit processing (e.g., a strip line pattern processing) may be carried out to a copper foil to be interposed with the opposed unit circuit boards so as to obtain a conductor circuit.

Then, preferably in a nitrogen gas atmosphere, the first unit circuit board 10 and the unit circuit board 20 are heated for a predetermined time (first degassing process). The conditions for degassing temperature and degassing time may follow the conditions described above.

Figure 2B:
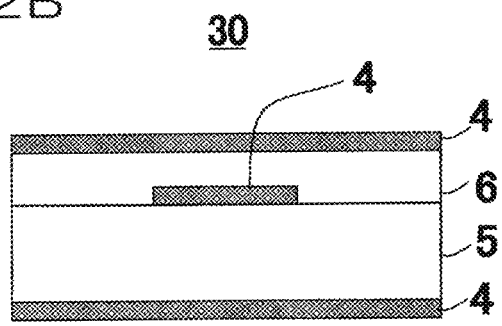

Thereafter, the first unit circuit board 10 and the second unit circuit board 20 are placed in stack in a chamber of a vacuum hot press apparatus (not shown) so as to obtain a stacked body 30 as shown in FIG. 2B. Then, heating treatment may be carried out for a predetermined time (second degassing process) while retaining a vacuum degree of 1500 Pa or lower by vacuuming. The conditions for degassing temperature and degassing time may follow the conditions described above.

Then, while maintaining the vacuum degree of 1500 Pa or lower, the heating temperature may be elevated to a temperature for carrying out a thermo-compression bonding to laminate each of the layers in the stacked body 30 under a predetermined compression pressure. The conditions of temperature as well as period for thereto-compression bonding may follow the conditions described above.

Thereafter, according to a conventional process, the conditions inside the apparatus are returned to ambient temperature and ambient pressure so as to collect a circuit board 30 from the apparatus.

In the above embodiment, the first unit circuit board 10 is directly attached to the second unit circuit board 20. Alternatively, as a modified embodiment, if necessary, a bonding sheet may be interposed between the first unit circuit board 10 and the second unit circuit board 20. As a further modified embodiment, a conductive circuit is formed to have a micro-strip line pattern and a coverlay may be used instead of the second unit circuit board 20.

Also, in the embodiment shown in FIG. 2B, the circuit board has three conductor layers. The number of conductor layers may be set appropriately, and may be one or more layers (for example, 2 to 10 layers).

Figure 3A:
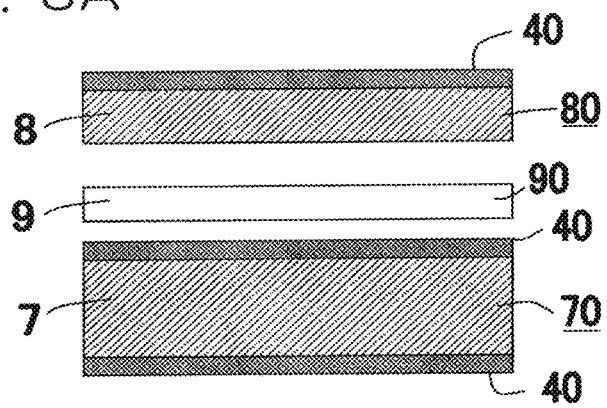
FIGS. 3A and 3B are schematic cross-sectional views for explaining a production process of a circuit board according to another embodiment of the present invention, and show states before and after lamination, respectively.

FIG. 3A is a schematic sectional view showing a state before lamination of a circuit board where laminating insulating substrates and a bonding sheet. Here are prepared a first unit circuit board (double-sided copper-clad laminate) 70 that comprises a first TLCP film 7 and copper foils 40,40 cladded on both surfaces of the film 7; a second unit circuit board (single-sided copper-clad laminate) 80 that comprises a second TLCP film 8 and a copper foil 40 cladded on one surface of the film 8; and a bonding sheet 90 of a third TLCP film 9 (a LCP film as an adhesive material) having a melting point lower than both of the TLCP films 7 and 8. Here, the first TLCP film 7 and the second TLCP film 8 may be made of the same material, and may have thicknesses being identical or different with each other.

Then after circuit-processing on the copper foil 40 of each unit circuit board, the copper foil surface of the first unit circuit board may be treated with FlatBOND GT (produced by MEC Co., Ltd.) to form an oxidation-resistant alloy layer (not shown) on the copper foil surface, and subsequently treated with FlatBOND GC (produced by MEC Co., Ltd.) for applying a silane-coupling agent so as to obtain a conductor layer.

Thereafter, preferably in a nitrogen gas atmosphere, the first unit circuit board 70, the second unit circuit board 80, and the bonding sheet 90 are heated for a predetermined time (first degassing process). The conditions for degassing temperature and degassing time may follow the conditions described above.

Figure 3B:
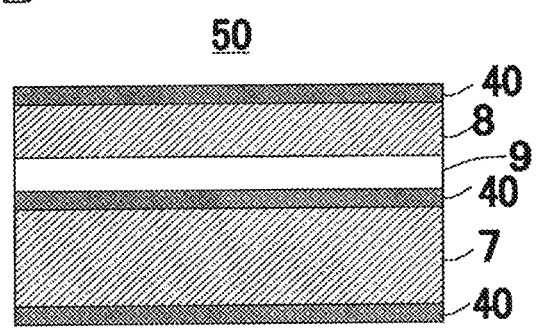

Thereafter, the first unit circuit board 70, the second unit circuit board 80, and the bonding sheet 90 are placed in stack in a chamber of a vacuum hot press apparatus (not shown) so as to obtain a stacked body 50 as shown in FIG. 3B. Then, heating treatment may be carried out for a predetermined time (second degassing process) while retaining a vacuum degree of 1500 Pa or lower by vacuuming. The conditions for degassing temperature and degassing time may follow the conditions described above.

Subsequently, while maintaining the vacuum degree of 1500 Pa or lower, the heating temperature is elevated to a temperature condition for carrying out a thermo-compression bonding to laminate the layers with each other in the stacked body 50 under a predetermined compression pressure. The conditions of temperature as well as period for thermo-compression bonding may follow the conditions described above.

Thereafter, according to a conventional process, the conditions inside the apparatus are returned to ambient temperature and ambient pressure so as to collect a circuit board 50 from the apparatus.

In the embodiments described above, the second unit circuit board is laminated to the first unit circuit board with or without a bonding sheet. The first unit circuit board comprises an insulating layer and conductor layers (copper foils) placed on both surfaces of the insulating layer. The second unit circuit board comprises an insulating layer and a conductor layer on one surface (upper surface) of the insulating layer. However, the configuration illustrated is not intended to limit the circuit board of the present invention. For example, the circuit board may have two conductor layers, or four or more conductor layers. The circuit board may comprise a coverlay of a LCP film to cover the conductor layer on the outermost layer.

Circuit Board

The circuit board (preferably a multi-layer circuit board) according to the fourth aspect of the present invention relates to a circuit board comprising a plurality of circuit board materials, wherein:

the circuit board materials are at least one member selected from the group consisting of an insulating substrate having a conductor layer on at least one surface, a bonding sheet, and a coverlay; and at least one of the circuit board materials comprises a TLCP film.

The circuit board has an improved heat resistance, and is a circuit board showing a solder heat resistance when the circuit board is placed in a solder bath at a temperature of 290° C. for 60 seconds conforming to a method of JIS C 5012. The solder heat resistance may be evaluated by observing a substrate sample that is subjected to solder float test in a solder bath at a temperature of 290° C. for 60 seconds conforming to a method of JIS C 5012 to be determined whether the substrate sample has blisters having a height of 100 µm or higher by sight or using an optical microscopy (5 magnifications or higher).

For example, the circuit board of the present invention may be a circuit board having the following configuration:

(i) a circuit board (multilayer or laminated circuit board) that comprises two or more unit circuit boards each including an insulating layer of a TLCP film (a first TLCP film) and a conductor layer(s) formed on one or both surfaces of the film, and a bonding sheet(s) interposing between the unit circuit boards, (ii) a circuit board (single layer or bilayer circuit board) that comprises a unit circuit board including an insulating layer of a TLCP film (a first LCP film) and a conductor layer(s) formed on one or both surfaces of the film, and a coverlay(s) to cover the conductor layer(s) of the unit circuit board, (iii) a configuration combining the above (i) and (ii), for example, a circuit board (multilayer or laminated circuit board) that comprises a unit circuit board, a bonding sheet(s), and a coverlay(s) to cover the conductor layer(s) of the unit circuit board, wherein the bonding sheet(s) interposes between the unit circuit board, and the outermost layer of the circuit board comprises the coverlay covering the conductor layer(s) of the unit circuit board, (iv) a circuit board (multilayer or laminated circuit board) that comprises two or more unit circuit boards, each including an insulating layer of a TLCP film (a substrate layer), wherein the unit circuit boards are directly laminated without a bonding sheet(s), and (v) a configuration combining the above (ii) and (iv), for example, a circuit board (multilayer or laminated circuit board) that comprises two or more unit circuit boards and a coverlay(s), wherein the unit circuit boards are directly laminated without a bonding sheet, and the outermost layer of the circuit board comprises the coverlay covering the conductor layer(s) of the unit circuit board.

It should be noted that, as already mentioned in the producing method, a surface of the conductor layer on the side of bonding to a circuit board material may have a surface roughness ($Rz_{JIS}$) of 1.25 µm or less as an average value of ten-points measured according to a method conforming to ISO4287-1997.

Further, since the adhesive property of the TLCP film is improved in the above circuit board, the circuit board may have an improved bonding strength between the TLCP film and a circuit board material in contact with the TLCP film, as a value measured in accordance with JIS C5016-1994. Where the circuit board material is an insulating substrate material (preferably, another TLCP film), the bonding strength between the TLCP film and the insulating substrate material may be 0.8 kN/m or higher (e.g., 0.8 to 3 kN/m), preferably 0.9 kN/m or higher, more preferably 1 kN/m or higher, and further preferably 1.1 kN/m or higher. It should be noted that the bonding strength may be determined as a peel strength value measured conforming to JIS C5016-1994 by peeling a TLCP film from an adherend at a peeling angle of 90° and at a peeling rate of 50 mm per minute using a tensile tester ("Digital force gauge FGP-2" produced by NIDEC-SHIMPO CORPORATION.)

Further, since the adhesive property of the LCP film is improved in the above circuit board, where the circuit board material is a conductor layer, the bonding strength in accordance with JIS C5016-1994 between the TLCP film and the conductor layer may be 0.3 kN/m or higher (e.g., 0.3 to 2 kN/m), and preferably 0.5 kN/m or higher.

It should be noted that upon determining interlayer adhesion, existence of cohesive failure could be generally determined as an evidence of good bonding. In contrast, occurrence of interfacial separation shows poor bonding in many cases.

Preferably, the circuit board is generally improved in bonding strength in every direction. For example, with respect to a first direction (A direction) of a circuit board sample and a second direction (B direction) perpendicular to the first direction, where bonding strengths of the sample are measured in four direction by peeling from both sides, i.e., in a forward A direction, in an adverse A direction, in a forward B direction, and in an adverse B direction, (i) the minimum bonding strength in the four directions between the TLCP film and an insulating substrate material may be 0.5 kN/m or higher (e.g., 0.5 to 3 kN/m), preferably 0.6 kN/m or higher, more preferably 0.7 kN/m or higher, still more preferably 0.8 kN/m or higher, and particularly preferably 0.9 kN/m or higher, and/or (ii) the minimum bonding strength in the four directions between the TLCP film and a conductor layer may be 0.25 kN/m or higher (e.g., 0.25 to 2 kN/m), preferably 0.28 kN/m or higher, and more preferably 0.5 kN/m or higher.

In the circuit board comprising the circuit board materials, the circuit board materials may comprise at least two TLCP films including a first TLCP film and a second TLCP film, wherein a conductor layer is interposed between the first and the second TLCP films. The difference in melting point between the first TLCP film and the second TLCP film may be in the range described above. Also, in order to enhance high frequency characteristics, all of the circuit board materials preferably comprise TLCP films.

Moreover, depending on thermo-adhesive property of TLCP films, the circuit board may have a configuration without a bonding sheet, i.e., direct bonding of insulating substrates with each other, or direct bonding of an insulating substrate and a coverlay. For example, non-use of the bonding sheet makes it possible to achieve a circuit board with a reduced thickness.

Figure 4:
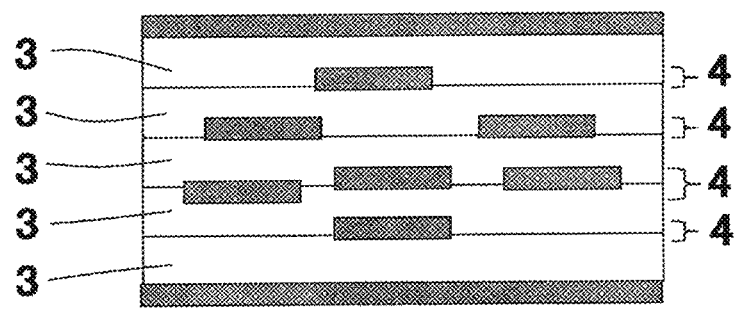
FIG. 4 is a schematic cross-sectional view for explaining a structure of one embodiment of the present invention comprising n layers of the conductor layers and (n+1) layers of the insulating layer containing the conductor layers inside.

For example, as shown in FIG. 4, the circuit board may comprise n layers of conductor layer 4 and n+1 layers of insulating layer (or a TLCP film layer) 3 wherein each of the conductor layers is interposed between the insulating layers. In this case, if necessary, the circuit board may be provided with a conductor layer on the outermost layer. It should be noted that where one portion of the conductor layer is originally formed on an upper layer of an insulating layer and another portion of the conductor layer is originally formed on a lower layer of an insulating layer, as long as these parts are interposed between the same insulating layers, these parts are regarded as belonging to the same conductor layer.

Further, since the circuit board with an adhesive-improved TLCP film(s) makes it possible to be thermo-compression bonded at a lower pressure (preferably, at a lower temperature and lower pressure). As a result, the subduction (sinking) of the conductor circuit, the subduction being caused in the thermo-compression bonding, can be reduced, resulting in improvement in reliability of the circuit board.

Figure 5A:
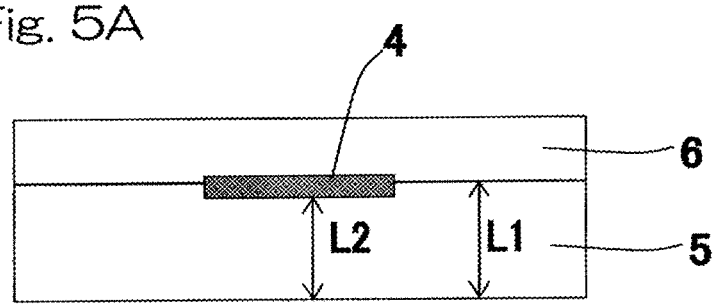
FIG. 5A is a schematic cross-sectional view showing a laminate comprising a conductor circuit and two sheets of liquid crystal polymer film sandwiching the conductor circuit for explaining a subduction amount of the conductor layer into the circuit board according to an embodiment of the present invention.

For example, FIG. 5A shows a schematic cross-sectional view showing a laminate sample comprising a conductor circuit 4, and LCP films 5 and 6 obtained by cutting the sample vertically to the conductor circuit. Where L1 denotes the thickness of the LCP film 5 at which the conductor circuit 4 is not formed, and L2 denotes the thickness of the insulating substrate at which the conductor circuit is formed, the measured thicknesses L1 and L2 can be used for calculating a L2/L1 ratio in percentage that an index parameter for subduction. The ratio of L2/L1 in percentage may be 80 to 100%, preferably 85 to 100%, and more preferably 90 to 100%. It should be noted that where there is no subduction, the ratio is 100% because of L1=L2. The larger the subduction amount is, the lower the percent ratio is. The thickness L2 may be measured as a distance L2 between the lower surface of the conductor circuit 4 and the bottom surface of the LCP film 5.

Figure 5B:
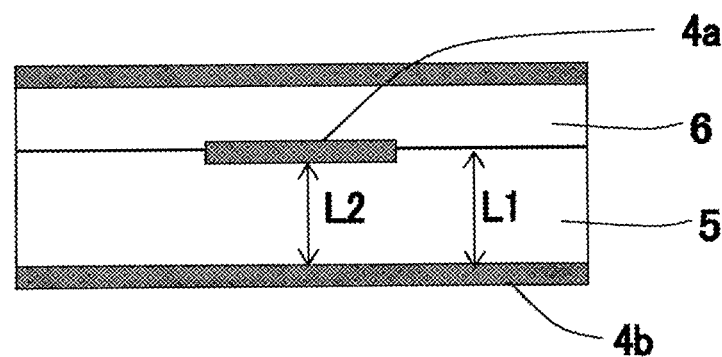
FIG. 5B is a schematic cross-sectional view showing a laminate further comprising a ground conductor on both surfaces of the laminate of FIG. 5A in the circuit board according to an embodiment of the present invention.

As shown in FIG. 5B, where a ground conductor 4b is formed on the bottom surface of the LCP film, the L1 may be determined as a distance from the boundary surface between the adjacent LCP films to the upper surface of the ground conductor 4b. The L2 may be determined as a distance from the lower surface of the conductor circuit 4a to the upper surface of the ground conductor 4b in the circuit board.

Since the circuit board according to the present invention can employ, as an insulating material, a thermoplastic liquid crystal polymer excellent in dielectric characteristics, the circuit board can be used particularly suitably as a high frequency circuit board. Examples of high frequency circuits include a circuit for transmitting mainly (only) high frequency signals; in addition; a circuit for a transmission line transmitting low frequency signals, for example, a circuit for a transmission line transmitting low frequency signals as output after converting high frequency signals into low frequency signals, a circuit for a transmission line supplying electronic power to drive high frequency-corresponding parts; as well as a circuit provided with the above circuits or transmission lines on the same plane.

For example, at a frequency of 10 GHz, the circuit board ($\in_r$) may have a relative dielectric constant of, for example, from 2.6 to 3.5, and more preferably from 2.6 to 3.4.

Also, for example, at a frequency of 10 GHz, the circuit board may have a dielectric loss tangent (Tan δ) of, for example, from 0.001 to 0.01, and more preferably from 0.001 to 0.008.

EXAMPLES

Hereinafter, the present invention is described in greater detail by examples, but the invention is not limited in any way by the present invention to this embodiment. In the following Examples and Comparative Examples were measured for various physical properties by the following method.

Melting Point

Melting point of a film was determined based on the observation of thermal behavior of the film using a differential scanning calorimeter. A test film was heated at a rate of 20° C./min to completely melt the film, and the melt was rapidly cooled to 50° C. at a rate of 50° C./min. Subsequently, the quenched material was reheated at a heating rate of 20° C./minute, and a position of an endothermic peak appearing in the reheating process was recorded as a melting point of the film.

Moisture Content

Karl Fischer method was employed as a measuring method of moisture content, that is, moisture content was measured by observing change in potential difference before and after allowing moisture absorbed in a solvent in accordance with the principle of the Karl Fischer titration.

(1) Device name for trace moisture measurement: VA-07, CA-07 available from Mitsubishi Chemical Analytech Co., Ltd.

(2) Heating temperature: 260° C.

(3) $N_2$ purge pressure: 150 mL/min.

(4) Measurement preparation (automatic)

Purge: 1 minute

Pre-heat: 2 minutes for baking a sample board

Cooling: 2 minutes for cooling the sample board (5) Measurement

Time for accumulating moisture in a measurement titration cell, i.e., time for sending moisture with $N_2$: 3 minutes (6) Sample weight: 1.0 to 1.3 g Segment Orientation Ratio (SOR)

Using a microwave type molecular orientation meter, a liquid crystal polymer film is inserted into a microwave resonance waveguide tube such that a propagation direction of microwave is perpendicular to the film surface, and electric-field strength (microwave transmission intensity) of microwave transmitting through the film is measured. Then, based on the measured value, m value (referred to as refractive index) is calculated from the following formula:

$$m=(Zo/\Delta z) \times [1-vmax/vo]$$

Here, Zo represents a device constant, Δz represents an average thickness of an object subjected to the measurement, vmax represents the frequency at which the maximum microwave transmission intensity can be obtained when the frequency of the microwave is varied, and vo represents the frequency at which the maximum microwave transmission intensity can be obtained when the average thickness is zero, that is, when no object is present.

Next, when the rotation angle of the object relative to the direction of oscillation of the microwaves is 0°, that is, when the direction of oscillation of the microwaves is aligned with the direction in which molecules of the object are most oriented as well as in which the minimum microwave transmission intensity is exhibited, an m value obtained in such a case was represented as $m_0$. An m value obtained as $m_{90}$ represents the value of the refractive index when the angle of rotation of the object is 90°. A segment orientation ratio SOR was calculated as $m_0/m_{90}$.

Film Thickness

Thicknesses of an obtained film were measured at intervals of 1 cm in the TD direction using a digital thickness meter (manufactured by Mitutoyo Corporation), and the film thickness was determined as an average thicknesses of 10 points arbitrarily selected from a center portion and end portions.

Heat Resistance Test

Solder float test was carried in conformity with JIS C 5012 to examine solder heat resistance of the circuit board. The solder heat resistance was evaluated by observing a substrate sample that was subjected to solder float test in a solder bath of 290° C. for 60 seconds whether the substrate sample had at least one blister having an area of 100 μm×100 μm or wider by sight or using an optical microscopy (5 magnifications or higher).

Specifically, from a circuit board sample having a size of 30 cm square (30 cm×30 cm) were derived five circuit board samples each having a size of 5 cm square (5 cm×5 cm) by randomly cutting. Each of the five circuit board samples were subjected to the solder float test, and blister occurrence was observed by sight or using an optical microscopy (5 magnifications or higher). Where blister was not observed in all of the five cut samples, the originated circuit board sample was determined as good, i.e., showing solder heat resistance. Where blister was observed in any one of the five cut samples, the originated circuit board sample was determined as poor.

Method for Measuring Bonding Strength Between Adjacent Circuit Board Materials

In conformity to JIS C5016-1994, peel strength was measured by peeling one of two bonding circuit board materials from the other material at a peeling angle of 90° and at a peeling rate of 50 mm per minute using a tensile tester ["Digital force gauge FGP-2" produced by NIDEC-SHIMPO CORPORATION.]. The obtained value was regarded as bonding strength (peeling strength).

It should be noted that bonding strength was measured in four directions with respect to a first direction (MD direction) of a circuit board sample and a second direction (TD direction) perpendicular to the first direction, by peeling from both sides, i.e., in a forward MD direction (or MD-proceeding direction), in an adverse MD direction (or MD-reversing direction), in a forward TD direction (or rightward TD direction), and in an adverse TD direction (or leftward TD direction). The average value in the four directions was treated as a representative bonding strength of the circuit board.

It should be noted that where circuit board material has a conductive material, bonding strength is determined depending on the surface area ratio of the conductive material portion in contact with the TLCP film. The surface area ratio may be determined as existing ratio of conductive material as follows:

Existing ratio of conductive material =

(Surface area of circuit patterns on circuit board unit in contact with the target LCP film)/

(Surface area of entire circuit board unit) × 100

Where the ratio is 30% or more, the bonding strength was measured as a bonding strength between the LCP film and a conductor layer. Where the ratio is less than 30%, the bonding strength was measured as a bonding strength between the LCP film and an insulating substrate material.

Method for Measuring Surface Roughness

A copper foil surface in a laminate (B) was subjected to roughening treatment, and then an arithmetic mean roughness (Ra) and a surface roughness ($Rz_{JIS}$) of the treated surface were measured using a stylus-type surface roughness tester ("SJ-201" produced by Mitutoyo Corp.). Measurement was carried out conforming to ISO 4287-1997. More specifically, the arithmetic mean roughness Ra is a value that shows an average value of the absolute value of the deviation from the mean line; the surface roughness ($Rz_{JIS}$) is an average value of ten points selected from a roughness curve in a sampled standard length along the direction of the average line as the sum of the average of the absolute values of the 5 highest peak points (convex top points) and the average of the absolute values of the 5 lowest valley points (concave bottom points) in the sampled section, and is express in μm.

Subduction

A laminate containing a conductor circuit was cut to give a cross-sectional sample vertical to the conductor circuit. The sample was placed on a Pt sputtering machine to form a Pt film (thickness: 20 Å) on the surface. Then, using a scanning electron microscope ("SU-70" produced by Hitachi High-Technologies Corporation.), secondary electron image of the laminate in the cross section (SEM image) was obtained at an accelerating voltage of 5 kV to observe the degree of subduction.

As shown in FIG. 5B, with respect to a laminate containing LCP films and a ground conductor adjacent to one of the LCP film, the L1 was determined as a distance from the boundary surface between the adjacent LCP films to the ground conductor; the L2 was determined as a distance from the lower surface of the conductor circuit to the upper surface of the ground conductor in the circuit board. After calculating a ratio of L2/L1 in percentage, subduction of the circuit board was evaluated in accordance with the following criteria:

Good: Ratio of L2/L1 is 80% or more.

Poor: Ratio of L2/L1 is less than 80%.

Where no subduction occurred, the ratio is 100% because of L1=L2. The larger subduction is, the lower the percentage ratio is.

Resin Flow

Occurrence of resin flow in 10 cm circuit board samples was visually observed. A sample having a resin flow of 1 mm or less was determined as good in quality; a sample having a resin flow of over 1 mm was determined as poor in quality.

Example 1

(1) Production of Adhesive-Improved LCP Film

A copolymerization product of p-hydroxybenzoic acid and 6-hydroxy-2-naphthoic acid (mole ratio: 73/27), being a thermoplastic liquid crystal polymer having a melting point of 280° C., was melted and extruded by inflation method to obtain a rolled product (winding thickness W=600 mm) of a thermoplastic liquid crystal polymer film having a melting point of 280° C., a film thickness of 50 μm, and a segment orientation ratio SOR of 1.02. The TLCP film in the rolled product had a moisture content of 400 ppm.

Thus obtained TLCP film rolled product was degassed by heat treatment for 60 minutes at a temperature of 120° C. Thus-degassed TLCP film in the rolled product had a moisture content of 200 ppm and a segment orientation ratio SOR of 1.02.

(2) Production of Unit Circuit Board

From a copolymerization product of p-hydroxybenzoic acid and 6-hydroxy-2-naphthoic acid (mole ratio: 73/27) was obtained a TLCP film having a melting point of 280° C. and a film thickness of 50 μm. The TLCP film was heat-treated under nitrogen atmosphere at 260° C. for 4 hours, and at 280° C. for another 2 hours to increase a melting point into 325° C. Onto each surface of the film, a rolled copper foil (JX Nippon Mining & Metals Corporation, BHYX-T-12, thickness: 12 μm) was set to be laminated using a continuous heat-pressing machine with a pair of rolls at a roll temperature of 290° C., a linear pressure of 100 kg/cm, a line speed of 2 m/min to obtain a copper-clad laminate. The copper-clad laminate was processed to produce a unit circuit board having a strip line structure. The TLCP film in the unit circuit board had a moisture content of 400 ppm.

(3) Production of Multilayer Circuit Board

The adhesive-improved LCP film obtained in the process (1) was used as a bonding sheet to be interposed between two sheets of the unit circuit boards to obtain a stacked material. The stacked material was placed in a vacuum heat press apparatus. Thereafter, the stacked material was thermo-compression bonded under vacuum at a vacuum degree of 1300 Pa and a compression pressure of 4 MPa at 300° C. for 30 minutes to be bonded with each other to obtain a circuit board having a configuration of unit circuit board/bonding sheet/unit circuit board. The obtained circuit board was evaluated in various physical properties. Table 7 shows obtained properties.

Example 2

(1) Production of Circuit Board

A stacked material was prepared in the same manner with Example 1 except for using, as a bonding sheet, a non-degassed TLCP film having a melting point of 280° C., a film thickness of 50 μm, a moisture content of 400 ppm, and a segment orientation ratio SOR of 1.02 obtained from a copolymerization product of p-hydroxybenzoic acid and 6-hydroxy-2-naphthoic acid (mole ratio: 73/27). The stacked material in which the bonding sheet was interposed between two sheets of the unit circuit boards was placed in a vacuum heat press apparatus.

Thereafter, the stacked material was subjected to degassing under vacuum at a vacuum degree of 1000 Pa and a compression pressure of 0.5 MPa at 120° C. for 60 minutes to be degassed in the stacked configuration.

After degassing under vacuum, the stacked material was subjected to thermo-compression bonding in the same way as Example 1 to be bonded with each other to obtain a circuit board having a configuration of unit circuit board/bonding sheet/unit circuit board. The obtained circuit board was evaluated in various physical properties. Table 7 shows obtained properties.

Example 3

(1) Production of Circuit Board

A circuit board was prepared in the same manner with Example 2 except for using, as a bonding sheet, an adhesive-improved TLCP film obtained in Example 1. The obtained circuit board was evaluated in various physical properties. Table 7 shows obtained properties.

Comparative Example 1

(1) Production of Circuit Board

A circuit board was prepared in the same manner with Example 1 except for using, as a bonding sheet, a non-degassed TLCP film having a melting point of 280° C., a film thickness of 50 μm, a moisture content of 400 ppm, and a segment orientation ratio SOR of 1.02 obtained from a copolymerization product of p-hydroxybenzoic acid and 6-hydroxy-2-naphthoic acid (mole ratio: 73/27). The obtained circuit board was evaluated in various physical properties. Table 7 shows obtained properties.

TABLE 7

| | Circuit board unit | | Bonding sheet | | | Degass under vacuum | |
|---|---|---|---|---|---|---|---|
| | Insulating substrate | Moisture content (ppm) | Film | Moisture content (ppm) | SOR | Vacuum degree (Pa) | Temp. (° C.) |
| Ex. 1 | LCP film (Tm325° C.) | 400 | Adhesive-improved LCP film (Tm280° C.) | 200 | 1.02 | — | — |
| Ex. 2 | LCP film (Tm325° C.) | 400 | LCP film (Tm280° C.) | 400 | 1.02 | 1000 | 120 |
| Ex. 3 | LCP film (Tm325° C.) | 400 | Adhesive-improved LCP film (Tm280° C.) | 200 | 1.02 | 1000 | 120 |
| Com. Ex. 1 | LCP film (Tm325° C.) | 400 | LCP film (Tm280° C.) | 400 | 1.02 | — | — |

TABLE 7-continued

| | Degass under vacuum | | Thermo-compression bonding | | | | Circuit board | |
|---|---|---|---|---|---|---|---|---|
| | | | Vacuum | | | | Heat | Bonding |
| | Pressure (MPa) | Period (min) | degree (Pa) | Temp. (° C.) | Pressure (MPa) | Period (min) | resistance (290° C.) | strength (kN/m) |
| Ex. 1 | — | — | 1300 | 300 | 4 | 30 | Good | 1.0 |
| Ex. 2 | 0.5 | 60 | 1300 | 300 | 4 | 30 | Good | 1.0 |
| Ex. 3 | 0.5 | 60 | 1300 | 300 | 4 | 30 | Good | 1.5 |
| Com. Ex. 1 | — | — | 1300 | 300 | 4 | 30 | Poor | 0.5 |

As shown in Table 7, since each of the circuit boards in Examples 1 and 3 uses the adhesive-improved LCP film as a bonding sheet, the interlayer adhesion of the circuit boards can be improved even in the conventional thermo-compression bonding procedure. These circuit boards also have enhanced heat resistance so that occurrence of blisters can be suppressed at high temperatures.

Meanwhile, Example 2 does not employ the adhesive-improved LCP film as the circuit board material. However, because of the degassing process for the stacked material under vacuum before thermo-compression bonding, the interlayer adhesion of the circuit board can be also enhanced after thermo-compression bonding. The circuit board also has enhanced heat resistance so that occurrence of blisters can be suppressed at high temperatures.

In particular, in Example 3, usage of the adhesion-improved LCP film as the bonding sheet in combination with the specific degassing process makes it possible to achieve particularly excellent interlayer adhesion.

On the other hand, Comparative Example 1, which neither employs the adhesion-improved LCP film nor is subjected to the degassing process, deteriorates in interlayer adhesion, showing lower bonding strength than those in Examples. Further, some samples in Comparative Example 1 have blisters at the high temperature.

Example 4

(1) Production of Unit Circuit Board

Onto each surface of a TLCP film having a melting point of 335° C. ("CT-Z", produced by Kuraray Co., Ltd., thickness: 25 μm), a rolled copper foil ("BHYX-T-12", produced by JX Nippon Mining & Metals Corporation, thickness: 12 μm) was overlaid to obtain a stacked material. The stacked material was placed in a vacuum heat press apparatus with heated plates at 295° C. under a compression pressure of 4 MPa for 10 minutes to be bonded with each other to obtain a first copper-clad laminate having a configuration of copper foil/first TLCP film/copper foil. In the meantime, onto each surface of a TLCP film having a melting point of 280° C. ("CT-F", produced by Kuraray Co., Ltd., thickness: 50 μm), a rolled copper foil ("BHYX-T-12", produced by JX Nippon Mining & Metals Corporation, thickness: 12 μm) was overlaid to obtain a stacked material. The stacked material was placed in a vacuum heat press apparatus with heated plates at 275° C. under a compression pressure of 4 MPa for 10 minutes to be bonded with each other to obtain a second copper-clad laminate having a configuration of copper foil/second TLCP film.

Subsequently, one copper foil of the first copper-clad laminate was processed by a chemical etching process to have a circuit pattern of a strip line structure (existing conductive material ratio: less than 30%) to obtain a first unit circuit board.

The first unit circuit board and the second copper-clad laminate were stacked so that the circuit pattern was interposed between the first and second TLCP films to obtain a stacked material. The stacked material was subjected to degassing under heating at 100° C. under atmospheric pressure at a pressing pressure of 0 MPa for 1 hour (a first degassing process: degassing under heating).

Subsequently, the stacked material of the first unit circuit board and the second copper-clad laminate, in which the circuit pattern was interposed between the first and second TLCP films, was placed in a chamber of a vacuum hot press apparatus for degassing under vacuum at a vacuum degree of 1000 Pa with heating at 100° C. under a compression pressure of 0 MPa for 1 hour (second degassing: degassing under vacuum).

Then, the stacked material was subjected to two-stage press, i.e., first compression-bonding by means of heated plates set to 150° C. under a compression pressure of 4 MPa for 5 minutes (pre-process), followed by second compression-bonding by means of heated plates set to 300° C. under a compression pressure of 1 MPa for 30 minutes (post-process) to obtain a circuit board having a multilayer configuration of copper foil/first TLCP layer/circuit layer/second TLCP layer/copper foil. The obtained circuit board was evaluated in various physical properties. Table 8 shows obtained properties.

Figure 6A:
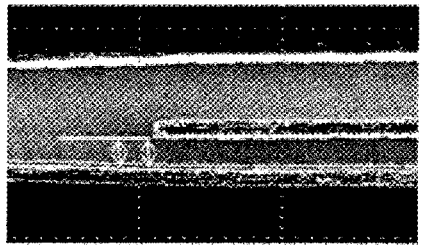
FIGS. 6A, 6B and 6C show cross sectional SEM images of Examples 4 and 5 and Comparative Example 4, respectively. Scale width in the image is 100 μm, and the SEM images have the same magnification with each other.

It should be noted that FIG. 6A shows an SEM image of thus-obtained circuit board. As shown in FIG. 6A, in which the white portion shows liquid crystal polymer, the boundary surface between the first TLCP layer and the second TLCP layer can be observed. A copper stripe or the copper foil portion can be observed as a white or high contrast part in monochrome. Observation of FIG. 6A reveals that subduction of circuit layer into the TLCP layer is suppressed.

Example 5

Onto each surface of a TLCP film having a melting point of 335° C. ("CT-Z", produced by Kuraray Co., Ltd., thickness: 25 μm), a rolled copper foil ("BHYX-T-12", produced by JX Nippon Mining & Metals Corporation, thickness: 12 μm) was overlaid to obtain a stacked material. The stacked material was placed in a vacuum heat press apparatus with heated plates at 295° C. under a compression pressure of 4 MPa for 10 minutes to be bonded with each other to obtain a second copper-clad laminate having a configuration of copper foil/second TLCP film. The circuit board was produced in the same manner with Example 4 except for using the second copper-clad laminate as obtained above. The obtained circuit board was evaluated in various physical properties. Table 8 shows obtained properties.

Figure 6B:
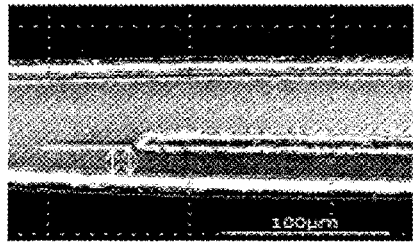

It should be noted that FIG. 6B shows an SEM image of thus-obtained circuit board. Observation of FIG. 6B reveals that subduction of circuit layer into the TLCP layer is suppressed.

Comparative Example 2

A circuit board was produced in the same manner as in Example 4 except for carrying out neither degassing under heating nor degassing under vacuum. The obtained circuit board was evaluated in various physical properties. Table 8 shows obtained properties.

Comparative Example 3

A circuit board was produced in the same manner as in Example 5 except for carrying out neither degassing under heating nor degassing under vacuum. The obtained circuit board was evaluated in various physical properties. Table 8 shows obtained properties.

Comparative Example 4

A circuit board was produced in the same manner as in Example 5 except that neither degassing under heating nor degassing under vacuum was carried out, and that two-stage press was carried out in the thermo-compression bonding, i.e., in a first compression-bonding by means of heated plates set to 150° C. under a compression pressure of 4 MPa for 5 minutes (pre-process), followed by second compression-bonding by means of heated plates set to 320° C. under a compression pressure of 3 MPa for 30 minutes (post-process). The obtained circuit board was evaluated in various physical properties. Table 8 shows obtained properties.

Figure 6C:
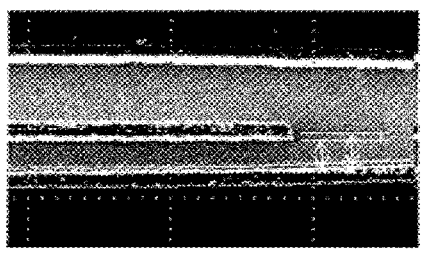

It should be noted that FIG. 6C shows an SEM image of thus-obtained circuit board. Observation of FIG. 6C reveals that the circuit layer is subducted into the LCP layer.

thermo-compression bonding is carried out under a low compression pressure of 1 MPa, it is possible to improve interlayer adhesion in the circuit board (between the adjacent TLCP films as well as between the TLCP film and the conductive layer). In particular, Examples 4 and 5 achieve satisfactory adhesion of directly bonding between unit circuit boards even without a bonding sheet used in Examples 1 to 3.

In addition, the production of these circuit boards under low compression pressure of 1 MPa in the main thermo-compression bonding process makes it possible to suppress not only resin flow during circuit board production but also subduction of the conductor layer into the TLCP film.

Furthermore, in Example 5, even if both of the TLCP films are high-melting-point films, it is possible to achieve satisfactory adhesion between the circuit board materials. Particularly surprisingly, in Example 5, even if the thermo-compression bonding is carried out at a temperature lower than the melting point of these high melting point films, it is possible to show satisfactory interlayer adhesion.

On the other hand, in Comparative Example 2 and Comparative Example 3, because of lack in degassing process, the obtained circuit boards are inferior in heat resistance as well as in interlayer adhesion being reduced by about 40% compared with the interlayer adhesion of Example 5.

In Comparative Example 4, since the production of the circuit board was carried out at a high temperature under high compression pressure in the main thermo-compression bonding process, bonding strength is improved whereas heat resistance is deteriorated. Further, resin flow is occurred during circuit board production, and the conductor layer is subducted into the TLCP film.

TABLE 8

| | Circuit board material | | | First degassing | | | Second degassing | | | |
| | | | | | | | Vacuum | | | |
| | First LCP film | Second LCP film | Environment | Temp. (° C.) | Pressure (MPa) | Period (mim) | degree (Pa) | Temp. (° C.) | Pressure (MPa) | Period (mim) |
|---|---|---|---|---|---|---|---|---|---|---|
| Ex. 4 | CTZ-25 (Tm335° C.) | CTF-50 (Tm280° C.) | Ambient pressure | 100 | 0 | 60 | 1000 | 100 | 0 | 60 |
| Ex. 5 | CTZ-25 (Tm335° C.) | CTZ-50 (Tm335° C.) | Ambient pressure | 100 | 0 | 60 | 1000 | 100 | 0 | 60 |
| Com. Ex. 2 | CTZ-25 (Tm335° C.) | CTF-50 (Tm280° C.) | — | — | — | — | — | — | — | — |
| Com. Ex. 3 | CTZ-25 (Tm335° C.) | CTZ-50 (Tm335° C.) | — | — | — | — | — | — | — | — |
| Com. Ex. 4 | CTZ-25 (Tm335° C.) | CTZ-50 (Tm335° C.) | — | — | — | — | — | — | — | — |

| | Thermo-compression | | Bonding strength LCP film/LCP film (kN/m) | | | Heat resistance (290° C.) | Resin flow | Subduction |
| | Compression Temp.(° C.) | Pressure (MPa) | Max. | Min. | Avg. | | | |
|---|---|---|---|---|---|---|---|---|
| Ex. 4 | 300 | 1.0 | 1.80 | 1.50 | 1.70 | Good | Good | Good |
| Ex. 5 | 300 | 1.0 | 1.20 | 1.00 | 1.05 | Good | Good | Good |
| Com. Ex. 2 | 300 | 1.0 | 0.80 | 0.60 | 0.63 | Poor | Good | Good |
| Com. Ex. 3 | 300 | 1.0 | 0.80 | 0.60 | 0.63 | Poor | Good | Good |
| Com. Ex. 4 | 320 | 3.0 | 1.30 | 1.10 | 1.14 | Poor | Poor | Poor |

As shown in Table 8, since each of the circuit boards in Examples 4 and 5 uses the LCP film subjected to the specific degassing process, the heat resistance of the circuit boards is improved. Further, even if the post-process as the main Various properties measured in the above Examples show advantageous properties such as heat resistance and interlayer adhesion in the combination of the insulating substrate and the bonding film, the combination of the insulating substrate and the coverlay, and the combination of the insulating substrate and the insulating substrate.

Next, on the basis of Examples 6 to 8 and Comparative Example 5, the influence of the surface roughness of the conductor layer on the circuit board will be discussed.

Example 6

Onto each surface of a TLCP film having a melting point of 335° C. ("CT-Z", produced by Kuraray Co., Ltd.), a rolled copper foil ("BHYX-T-12", produced by JX Nippon Mining & Metals Corporation, thickness: 12 μm) was overlaid to obtain a stacked material. The stacked material was placed in a vacuum heat press apparatus with heated plates at 295° C. under a compression pressure of 4 MPa for 10 minutes to be bonded with each other to obtain a first unit circuit board having a configuration of copper foil/TLCP film/copper foil as well as a second unit circuit board having a configuration of copper foil/TLCP film. The thicknesses of the TLCP films in the first unit circuit board and the second unit circuit board are 100 μm and 75 μm, respectively. Subsequently, each of the copper foils was processed by a chemical etching method (existing conductive material ratio: 30% or more).

Subsequently, the copper foils of the first unit circuit board were treated by a surface roughening treatment, more specifically, a treatment carried out with "FlatBOND GT and FlatBOND GC treatment" available from MEC Co., Ltd. Hereinafter this treatment is referred to as FlatBOND treatment. The conductor layer including an alloy layer had surface roughness Ra of 0.13 μm and $Rz_{JIS}$ of 1.05 μm.

The first unit circuit board, a bonding sheet (a TLCP film "CT-F" having a melting point of 280° C. and a thickness of 25 μm produced by Kuraray Co., Ltd.) and the second unit circuit board were overlaid in this order to obtain a stacked material. The stacked material was subjected to degassing under heating at 115° C. under atmospheric pressure, at a compression pressure of 0 MPa for 2 hours (a first degassing process).

Subsequently, as shown in FIG. 3B, the stacked material of the first unit circuit board and the second copper-clad laminate, in which the bonding sheet was interposed between the first and second unit circuit boards, was placed in a chamber of a vacuum hot press apparatus for degassing under vacuum at a vacuum degree of 1000 Pa with heating at 100° C. under a compression pressure of 0 MPa for 1 hour (second degassing).

Then, the stacked material was subjected to thermocompression bonding by means of heated plates set to 295° C. under a compression pressure of 1 MPa for 30 minutes (pre-process) to obtain a circuit board having a multilayer configuration of copper foil/first TLCP layer/second TLCP layer/circuit layer/first TLCP layer/copper foil as shown in FIG. 3B.

The obtained circuit board was evaluated in heat resistance, bonding strength, flowing property, and subduction of circuit layer. Table 9 shows obtained properties.

Example 7

A circuit board was produced in the same manner as in Example 6 except that the FlatBOND treatment was not carried out to the copper foils in the first unit circuit board. The obtained circuit board was evaluated in heat resistance, bonding strength, flowing property, and subduction of circuit layer. Table 9 shows obtained properties. It should be noted that the copper foil constituting the conductor layer had surface roughness Ra of 0.14 μm and $Rz_{JIS}$ of 1.09 μm.

Example 8

A circuit board was produced in the same manner as in Example 6 except that the surface roughening was carried out by a blackening treatment, which belongs to a conventional surface roughening treatment, instead of the FlatBOND treatment, and that the compression pressure was changed into 4 MPa. The obtained circuit board was evaluated in heat resistance, bonding strength, flowing property, and subduction of circuit layer. Table 9 shows obtained properties.

It should be noted that the blackening treatment was carried out by immersing the first unit circuit board for 2 minutes into a blackening treatment solution (aqueous solution) containing 31 g/L of sodium sulfite, 15 g/L of sodium hydroxide, 12 g/L of sodium phosphate kept in a warm bath at 95° C., followed by washing the immersed first unit circuit board with water and drying. The copper foil constituting the conductor layer had surface roughness Ra of 0.18 μm and $Rz_{JIS}$ of 1.31 μm.

Comparative Example 5

A circuit board was produced in the same manner as in Example 8 except for carrying out neither degassing under heating nor degassing under vacuum. The obtained circuit board was evaluated in various physical properties. Table 9 shows obtained properties.

TABLE 9

| | Circuit board unit | | | | First degassing | | | Second degassing | | | |
|---|---|---|---|---|---|---|---|---|---|---|---|
| | | Conductor layer | | | | | | Vacuum | | | |
| | Insulating | roughness (μm) | | Bonding | | Temp. | Pressure | Period | degree | Temp. | Pressure | Period |
| | substrate | Ra | $Rz_{JIS}$ | sheet | Environment | (° C.) | (MPa) | (mim) | (Pa) | (° C.) | (MPa) | (mim) |
| Ex. 6 | LCP film (Tm335° C.) | 0.13 | 1.05 | LCP film (Tm280° C.) | Ambient pressure | 115 | 0 | 120 | 1000 | 100 | 0 | 60 |
| Ex. 7 | LCP film (Tm335° C.) | 0.14 | 1.09 | LCP film (Tm280° C.) | Ambient pressure | 115 | 0 | 120 | 1000 | 100 | 0 | 60 |
| Ex. 8 | LCP film (Tm335° C.) | 0.18 | 1.31 | LCP film (Tm280° C.) | Ambient pressure | 115 | 0 | 120 | 1000 | 100 | 0 | 60 |
| Com. Ex. 5 | LCP film (Tm335° C.) | 0.18 | 1.31 | LCP film (Tm280° C.) | — | — | — | — | — | — | — | — |

TABLE 9-continued

| | Thermo-compression | | | | Bonding strength | | | Heat resistance | Resin flow | Subduction |
| --- | --- | --- | --- | --- | --- | --- | --- | --- | --- | --- |
| | Vacuum degree | Temp. | Pressure | Period | LCP film/Conductor layer (kN/m) | | | | | |
| | (Pa) | (° C.) | (MPa) | (mim) | Max. | Min. | Avg. | (290° C.) | | |
| Ex. 6 | 1000 | 295 | 1 | 30 | 0.9 | 0.7 | 0.84 | Good | Good | Good |
| Ex. 7 | 1000 | 295 | 1 | 30 | 0.4 | 0.3 | 0.37 | Good | Good | Good |
| Ex. 8 | 1000 | 295 | 4 | 30 | 1 | 0.8 | 0.95 | Good | Poor | Poor |
| Com. Ex. 5 | 1000 | 295 | 4 | 30 | 0.5 | 0.3 | 0.35 | Poor | Poor | Poor |

As shown in Table 9, in any of Examples, combination of a degassing process(es) at the specified condition makes it possible to suppress blister occurrence in the circuit board effectively.

In particular, in the circuit board of Example 6, since the FlatBOND treatment capable of achieving smooth surface of the copper foil is carried out in combination with the specific degassing process, the obtained circuit board has not only satisfactory heat resistance but also improved bonding strength in the circuit board.

It should be noted that in Examples 6 and 7 obtained by lowering the compression pressure at the time of thermo-compression bonding, it is possible to reduce the subduction amount into the insulating substrate; and that in Example 8 the circuit board has larger subduction amount of circuitry layer in the insulating substrate and is deteriorated in resin flowing because of high pressure in the thermo-compression bonding.

Then, on the basis of Examples 10 to 11 and Comparative Example 6, the effect of degassing process on the interlayer bonding strength of a circuit board will be considered.

Example 9

A circuit board was produced in the same manner as in Example 4 except that the first degassing was not carried out but the second degassing was carried out. The obtained circuit board was evaluated in various physical properties. Table 10 shows obtained properties.

Example 10

A circuit board was produced in the same manner as in Example 4 except that the first degassing was carried out but the second degassing was not carried out. The obtained circuit board was evaluated in various physical properties. Table 10 shows obtained properties.

Comparative Example 6

(1) Production of Unit Circuit Board

Onto each surface of a TLCP film having a melting point of 335° C. ("CT-Z", produced by Kuraray Co., Ltd., thickness: 25 μm), a rolled copper foil ("BHYX-T-12", produced by JX Nippon Mining & Metals Corporation, thickness: 12 μm) was overlaid to obtain a stacked material. The stacked material was placed in a vacuum heat press apparatus with heated plates at 295° C. under a compression pressure of 4 MPa for 10 minutes to be bonded with each other to obtain a first copper-clad laminate having a configuration of copper foil/first TLCP film/copper foil. In the meantime, onto one surface of a TLCP film having a melting point of 280° C. ("CT-F", produced by Kuraray Co., Ltd., thickness: 50 μm), a rolled copper foil ("BHYX-T-12", produced by JX Nippon Mining & Metals Corporation, thickness: 12 μm) was overlaid to obtain a stacked material. The stacked material was placed in a vacuum heat press apparatus with heated plates at 275° C. under a compression pressure of 4 MPa for 10 minutes to be bonded with each other to obtain a second copper-clad laminate having a configuration of copper foil/second TLCP film.

Subsequently, one copper foil of the first copper-clad laminate was processed by a chemical etching process to have a circuit pattern of a strip line structure (existing conductive material ratio: less than 30%) to obtain a first unit circuit board.

Subsequently, a stacked material of the first unit circuit board and the second copper-clad laminate, in which the circuit pattern was interposed between the first and second TLCP films, was placed in a chamber of a vacuum hot press apparatus to be subjected to two-stage press at a vacuum degree of 1000 Pa, i.e., first compression-bonding by means of heated plates set to 150° C. under a compression pressure of 4 MPa for 5 minutes (pre-process), followed by second compression-bonding by means of heated plates set to 320° C. under a compression pressure of 1 MPa for 30 minutes (post-process) to obtain a circuit board having a multilayer configuration of copper foil/first TLCP layer/circuit layer/second TLCP layer/copper foil. The obtained circuit board was evaluated in various physical properties. Table 10 shows obtained properties.

TABLE 10

| | Circuit board material | | First degassing | | | |
| --- | --- | --- | --- | --- | --- | --- |
| | First LCP film | Second LCP film | Environment | Temp. (° C.) | Pressure (MPa) | Period (min) |
| Ex. 9 | CTZ-25 (Tm335° C.) | CTF-50 (Tm280° C.) | — | — | — | — |
| Ex. 10 | CTZ-25 (Tm335° C.) | CTF-50 (Tm280° C.) | Ambient pressure | 100 | 0 | 60 |

TABLE 10-continued

| | | | | | | | |
|---|---|---|---|---|---|---|---|
| Com. Ex. 6 | CTZ-25 (Tm335° C.) | CTF-50 (Tm280° C.) | — | — | — | — | |

| | Second degassing | | | | Thermo-compression | | Bonding strength LCP film/LCP film (kN/m) | | |
|---|---|---|---|---|---|---|---|---|---|
| | Vacuum degree (Pa) | Temp. (° C.) | Pressure (MPa) | Period (min) | Compression Temp. (° C.) | Pressure (MPa) | Max. | Min. | Avg. |
| Ex. 9 | 1000 | 100 | 0 | 60 | 300 | 1.0 | 1.6 | 0.7 | 1.3 |
| Ex. 10 | — | — | — | — | 300 | 1.0 | 1.1 | 0.7 | 0.9 |
| Com. Ex. 6 | — | — | — | — | 320 | 1.0 | 0.7 | 0.3 | 0.5 |

As shown in Table 10, in Comparative Example 6 without being subjected to degassing process, bonding strength values are low with respect to not only the maximum and minimum values but also the average value of the whole directions. In particular, Comparative Example 6 has difficulty in improvement in bonding strength despite employing high thermo-compression temperature of 320° C. that is intended to increase the bonding strength. For example, in comparison with Example 4, the representative bonding strength value and the minimum bonding strength value of Comparative Example 6 are 1/3 or less and 1/5 or less of Example 4, respectively.

In Example 9, in which the second degassing process was carried out, the bonding strength can be increased in all of the maximum, minimum, and average values in comparison with Comparative Example 6. In Example 10, in which the first degassing process was carried out, the bonding strength can be increased in all of the maximum, minimum, and average values in comparison with Comparative Example 6. In these Examples 9 and 10, the bonding strengths of the circuit boards each evaluated from the four directions can achieve 0.7 kN/m as the minimum value, that is more than twice of the minimum bonding strength in Comparative Example 6.

INDUSTRIAL APPLICABILITY

The LCP films according to the present invention have satisfactory thermo-adhesive property, and can be advantageously used as various circuit board materials. Further, the circuit board of the present invention can be used as substrates for various electrical and electronic products. In particular, since the LCP film has excellent dielectric characteristics at high frequency, the circuit board according to the present invention can be advantageously used as a high frequency circuit board or the like.

Although the present invention has been fully described in connection with the preferred embodiments thereof, those skilled in the art will readily conceive numerous changes and modifications within the framework of obviousness upon the reading of the specification herein presented of the present invention. Accordingly, such changes and modifications are to be construed as included therein.

What is claimed is:

1. A circuit board, comprising a plurality of circuit board materials and having a predetermined structure, wherein:
   the circuit board materials are at least one member selected from the group consisting of an insulating substrate having a conductor layer on at least one surface, a bonding sheet, and a coverlay;
   at least one of the circuit board materials comprises a thermoplastic liquid crystal polymer film in contact with a circuit board material;
   the circuit board shows solder heat resistance when the circuit board is placed in a solder bath at a temperature of 290° C. for 60 seconds in accordance with a method of JIS C 5012; and
   where the thermoplastic liquid crystal polymer film and the circuit board material are peeled off along a first direction (A direction) or along a second direction (B direction) perpendicular to the first direction to measure the bonding strength between the thermoplastic liquid crystal polymer film and the circuit board material in accordance with JIS C5016-1994, the minimum value of bonding strength in four directions of a forward A direction, an adverse A direction, a forward B direction, and an adverse B direction is:
      (i) 0.5 kN/m or higher where the circuit board material is an insulating substrate material, or
      (ii) 0.25 kN/m or higher where the circuit board material is a conductor layer,
   wherein the thermoplastic liquid crystal polymer film has a segment orientation ratio SOR of 0.8 to 1.4 and a moisture content of 300 ppm or less, and the thermoplastic liquid crystal polymer film has been subjected to at least one degassing process:
      (i) by degassing the thermoplastic liquid crystal polymer film under vacuum of 1500 Pa or lower for 30 minutes or more,
      (ii) by degassing the thermoplastic liquid crystal polymer film under heating at a temperature ranging from 100° C. to 200° C., or
      (iii) by degassing the thermoplastic liquid crystal polymer film under the degassing processes (i) and (ii) simultaneously or separately.

2. The circuit board according to claim 1, wherein the degassing is performed by a process comprising:
   a first degassing of the prepared thermoplastic liquid crystal polymer film under heating at a temperature ranging from 100° C. to 200° C. for a predetermined period of time, and
   a second degassing of the thermoplastic liquid crystal polymer film after the first degassing under vacuum of 1500 Pa or lower for a predetermined period of time.

3. The circuit board according to claim 1, wherein the degassing under vacuum (i) is carried out while heating the film at a temperature ranging from 80° C. to 200° C. under vacuum of 1500 Pa or lower.

4. The circuit board according to claim 1, wherein the thermoplastic liquid crystal polymer film has a film thickness of 10 to 200 μm.

5. A method for producing a circuit board according to claim 1, wherein said method comprises:
preparing a plurality of circuit board materials;
stacking the prepared circuit board materials in accordance with a predetermined structure of a circuit board to obtain a stacked material, followed by conducting thermo-compression bonding of the stacked material by heating under a predetermined compression pressure; wherein
the prepared circuit board materials are at least one member selected from the group consisting of an insulating substrate having an conductor layer on at least one surface, a bonding sheet, and a coverlay, and
(I) at least one of the prepared circuit board materials comprises the thermoplastic liquid crystal polymer film,
(II) at least one of the prepared circuit board materials comprises a non-degassed thermoplastic liquid crystal polymer film, wherein the at least one degassing process is conducted after the preparation of the circuit board materials and before the thermo-compression bonding to form the thermoplastic liquid crystal polymer film, or
(III) at least one of the prepared circuit board materials comprises the thermoplastic liquid crystal polymer film wherein the at least one degassing is conducted after the preparation of the circuit board materials and before the thermo-compression bonding.

6. The circuit board according to claim 1, wherein the bonding strength between the thermoplastic liquid crystal polymer film and the circuit board material in accordance with JIS C5016-1994 is:
(i) 0.8 kN/m or higher where the circuit board material is an insulating substrate material, or
(ii) 0.3 kN/m or higher where the circuit board material is a conductor layer.

7. The circuit board according to claim 1, wherein:
the circuit board comprises a first thermoplastic liquid crystal polymer film, a second thermoplastic liquid crystal polymer film, and a conductor layer interposed between the first and second thermoplastic liquid crystal polymer films; and
difference in melting point between the first thermoplastic liquid crystal polymer film and the second thermoplastic liquid crystal polymer film is in a range from 0° C. to 70° C.

8. The circuit board according to claim 1, wherein at least one surface of the conductor layer has a surface roughness ($Rz_{JIS}$) of 1.25 μm or less as an average value of surface roughness of ten points measured according to a method conforming to ISO4287-1997.

9. The circuit board according to claim 1, comprising an insulating substrate having an upper surface and a lower surface, the upper surface provided with a conductor circuit, wherein:
the circuit board has a L2/L1 ratio in percentage of 80 to 100%;
L1 denotes the thickness of the insulating substrate portion at which the conductor circuit is not formed; and
L2 denotes the thickness of the insulating substrate portion at which the conductor circuit is formed.

10. The circuit board according to claim 1, wherein the thermoplastic liquid crystal polymer film has been subjected to a degassing process:
(i) by degassing the thermoplastic liquid crystal polymer film under vacuum of 1500 Pa or lower for 30 minutes or more, or
(ii) by degassing the thermoplastic liquid crystal polymer film under vacuum of 1500 Pa or lower for 30 minutes or more, and simultaneously or separately, degassing the thermoplastic liquid crystal polymer film under heating at a temperature ranging from 100° C. to 200° C.

11. The circuit board according to claim 1, wherein the thermoplastic liquid crystal polymer film has been subjected to at least one degassing process under reduced pressure.

12. The circuit board according to claim 2, wherein the second degassing process is carried out while heating the film at a temperature ranging from 80° C. to 200° C. under vacuum of 1500 Pa or lower.

13. The method for producing a circuit board according to claim 5, wherein the thermo-compression bonding of the circuit board materials is performed by heating the materials while compressing the materials under a compression pressure of 5 MPa or lower.

14. The method for producing a circuit board according to claim 5, wherein the circuit board materials are heated at a temperature ranging from (Tm−60°) C. to (Tm+40°) C. during the thermocompression bonding, where Tm is the melting point of the thermoplastic liquid crystal polymer film subjected to the thermocompression bonding.

15. The method for producing a circuit board according to claim 13, wherein the thermo-compression bonding of the circuit board materials is performed by heating the materials while compressing the materials under a compression pressure of 0.5 to 2.5 MPa.

* * * * *